United States Patent
Yamaguchi et al.

(10) Patent No.: US 7,732,241 B2
(45) Date of Patent: Jun. 8, 2010

(54) MICROSTRUCTURE AND MANUFACTURING METHOD THEREOF AND MICROELECTROMECHANICAL SYSTEM

(75) Inventors: Mayumi Yamaguchi, Kanagawa (JP); Konami Izumi, Kanagawa (JP); Kojiro Shiraishi, Kanagawa (JP)

(73) Assignee: Semiconductor Energy Labortory Co., Ltd., Atsugi-shi, Kanagawa-ken (JP)

( * ) Notice: Subject to any disclaimer, the term of this patent is extended or adjusted under 35 U.S.C. 154(b) by 124 days.

(21) Appl. No.: 11/562,711

(22) Filed: Nov. 22, 2006

(65) Prior Publication Data
US 2007/0238213 A1 Oct. 11, 2007

(30) Foreign Application Priority Data
Nov. 30, 2005 (JP) ............... 2005-345088

(51) Int. Cl.
H01L 21/20 (2006.01)
(52) U.S. Cl. ...................................... 438/52
(58) Field of Classification Search ............ 438/48–53; 216/2, 11
See application file for complete search history.

(56) References Cited

U.S. PATENT DOCUMENTS

| | | | | |
|---|---|---|---|---|
| 4,372,989 A | * | 2/1983 | Menzel | 427/555 |
| 4,477,316 A | * | 10/1984 | Sakai et al. | |
| 5,066,611 A | * | 11/1991 | Yu | |
| 5,208,187 A | | 5/1993 | Tsubouchi et al. | |
| 5,242,863 A | | 9/1993 | Xiang-Zheng et al. | |
| 5,290,731 A | * | 3/1994 | Sugano et al. | 438/653 |
| 5,801,069 A | * | 9/1998 | Harada et al. | 438/52 |
| 6,020,215 A | * | 2/2000 | Yagi et al. | 438/52 |
| 6,127,765 A | * | 10/2000 | Fushinobu | |
| 6,537,864 B1 | | 3/2003 | Aya et al. | |
| 6,762,471 B2 | * | 7/2004 | Kim | |
| 6,860,939 B2 | | 3/2005 | Hartzell | |
| 6,933,165 B2 | * | 8/2005 | Musolf et al. | 438/50 |
| 7,125,451 B2 | | 10/2006 | Hartzell | |
| 7,128,783 B2 | | 10/2006 | Hartzell | |
| 7,135,070 B2 | | 11/2006 | Hartzell | |
| 7,156,916 B2 | | 1/2007 | Hartzell | |
| 7,195,946 B2 | * | 3/2007 | D'Arrigo et al. | |
| 7,217,588 B2 | | 5/2007 | Hartzell et al. | |
| 7,230,306 B2 | | 6/2007 | Hartzell | |
| 7,253,488 B2 | | 8/2007 | Zhan et al. | |
| 7,253,705 B2 | * | 8/2007 | Song et al. | 333/187 |
| 7,299,529 B2 | * | 11/2007 | Ginsburg et al. | 29/25.35 |

(Continued)

FOREIGN PATENT DOCUMENTS

EP 0 465 264 A2 1/1992

(Continued)

*Primary Examiner*—Savitri Mulpuri
(74) *Attorney, Agent, or Firm*—Fish & Richardson P.C.

(57) ABSTRACT

An object is to provide a microstructure in which shear stress of a structural layer is increased, a manufacturing method thereof, and a microelectromechanical system. A sacrificial layer is formed over a substrate. A metal film is formed over the sacrificial layer. The metal film is irradiated with a laser beam. Needle-like crystals of the metal film are reduced or eliminated. The metal film is etched and processed into a predetermined shape to form a metal layer. Then, the sacrificial layer is removed. Accordingly, a microelectromechanical system which is excellent in reliability and in which a resistance property to breakage of a movable portion of the microstructure is improved can be provided.

24 Claims, 12 Drawing Sheets

U.S. PATENT DOCUMENTS

| | | | |
|---|---|---|---|
| 7,341,884 B2 * | 3/2008 | Hartzell | 438/48 |
| 7,528,529 B2 | 5/2009 | Yamaguchi et al. | |
| 7,537,953 B2 | 5/2009 | Tateishi et al. | |
| 2004/0207490 A1 * | 10/2004 | Jun et al. | |
| 2005/0085000 A1 * | 4/2005 | Ikeda et al. | 438/53 |
| 2005/0146401 A1 * | 7/2005 | Tilmans et al. | 333/187 |
| 2005/0218754 A1 * | 10/2005 | Yokoyama et al. | |
| 2006/0057756 A1 * | 3/2006 | Sato et al. | 438/50 |
| 2006/0166393 A1 * | 7/2006 | Ha et al. | |
| 2006/0202779 A1 * | 9/2006 | Fazzio et al. | |
| 2006/0267153 A1 | 11/2006 | Yamaguchi et al. | |
| 2006/0270238 A1 | 11/2006 | Izumi et al. | |
| 2006/0284183 A1 * | 12/2006 | Izumi et al. | |
| 2007/0001224 A1 | 1/2007 | Yamaguchi et al. | |
| 2007/0037311 A1 | 2/2007 | Izumi et al. | |
| 2007/0093045 A1 | 4/2007 | Yamaguchi et al. | |
| 2007/0120625 A1 * | 5/2007 | Larson, III et al. | |
| 2007/0222336 A1 * | 9/2007 | Grannen et al. | |

FOREIGN PATENT DOCUMENTS

| | | |
|---|---|---|
| JP | 04-065385 | 3/1992 |
| JP | 2001-189458 | 7/2001 |
| JP | 2004-001200 | 1/2004 |
| JP | 2004-312611 | 11/2004 |
| JP | 2005-123561 | 5/2005 |
| JP | 2005-210614 | 8/2005 |

* cited by examiner

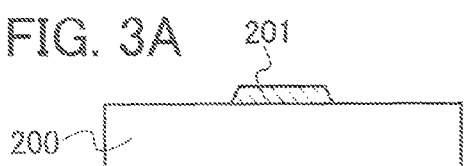
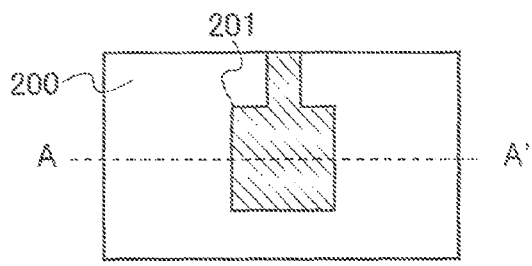
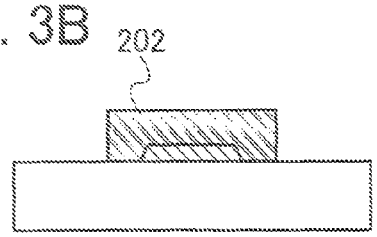
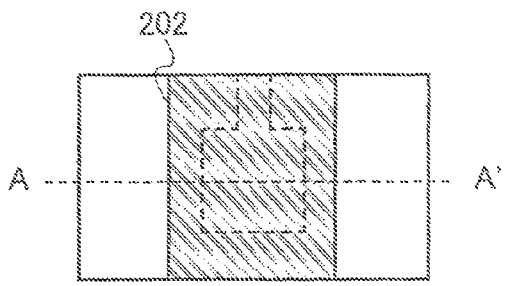
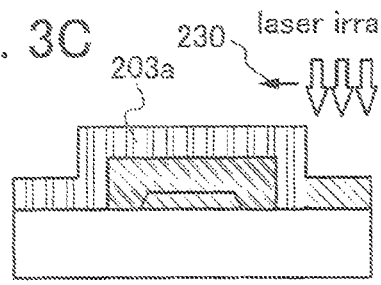
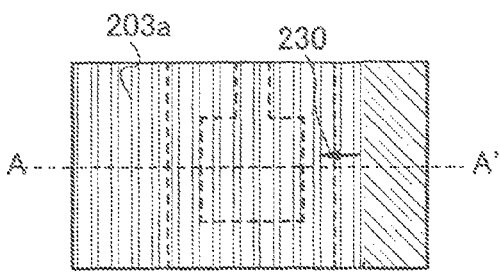
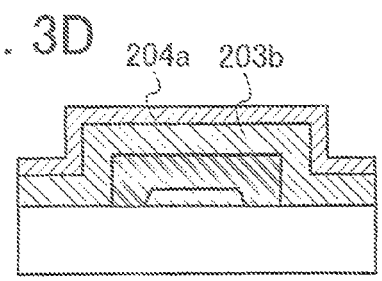
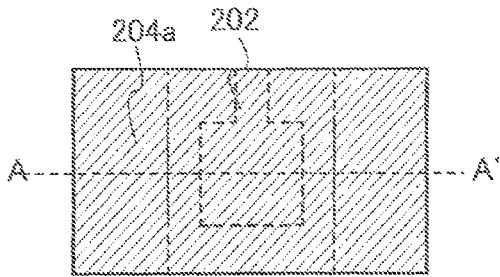
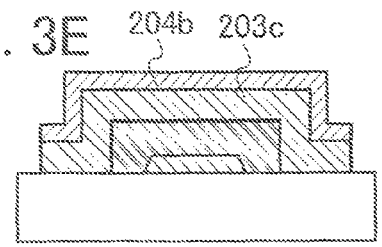
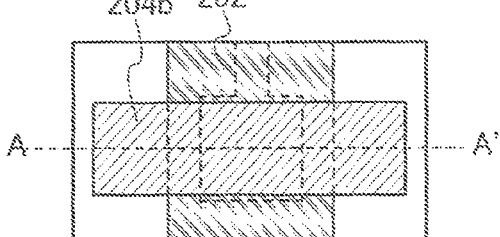
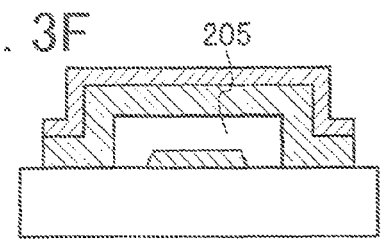
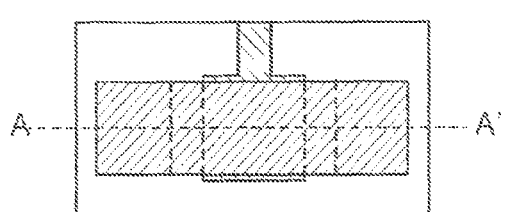

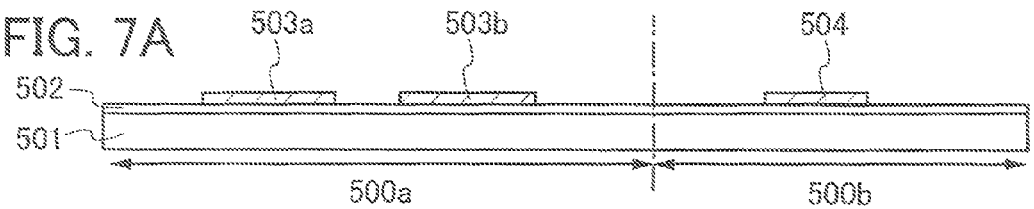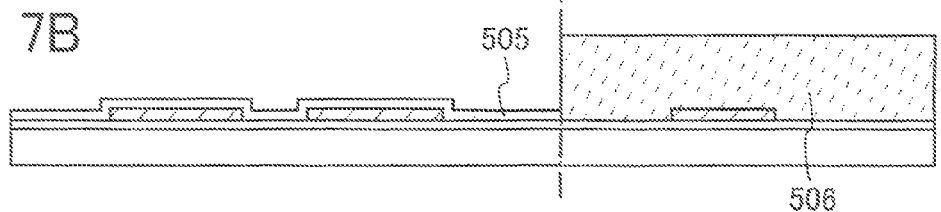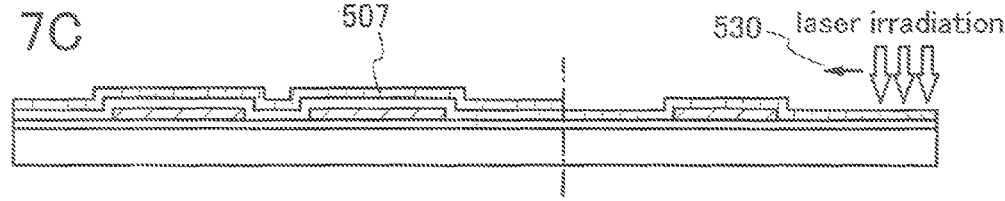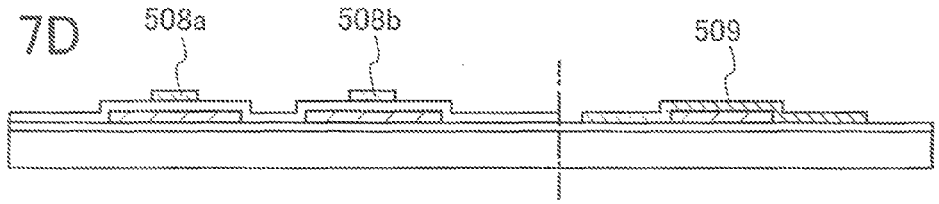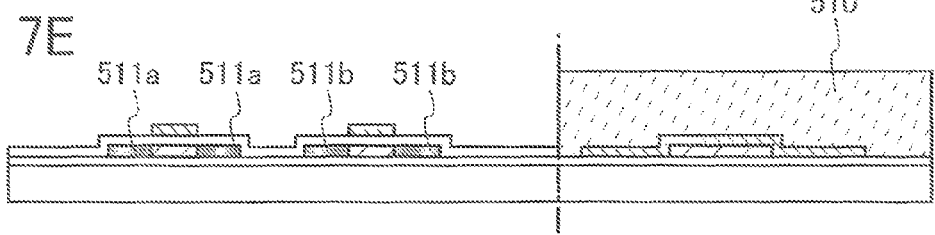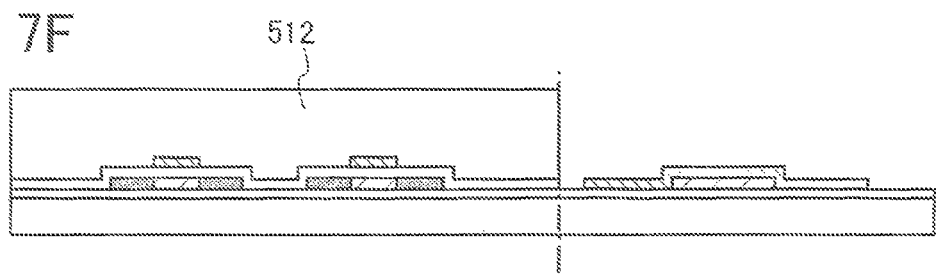

MICROSTRUCTURE AND MANUFACTURING METHOD THEREOF AND MICROELECTROMECHANICAL SYSTEM

BACKGROUND OF THE INVENTION

1. Field of the Invention

The present invention relates to a microstructure irradiated with a laser beam, a manufacturing method thereof, and a microelectromechanical system.

2. Description of the Related Art

In recent years, a device using a microelectromechanical system which is so-called micro electro mechanical systems (MEMS) such as a micro switch, an actuator, a pressure sensor, an acceleration sensor, or the like has been applied in various fields.

A structural layer is formed over a sacrificial layer, and then the structural layer is formed spatially in a space by removing the sacrificial layer by etching, so that a MEMS is driven.

Metal such as tungsten (W) or molybdenum (Mo) is used as such a structural layer which is used as an operation portion of a MEMS (e.g., see Reference 1: Japanese Published Patent Application No. 2005-210614). Tungsten and molybdenum are both group 6 elements, and have a property of high mechanical strength and a high-melting point (W: a melting point of 3430° C., and Mo: a melting point of 2620° C.).

In Reference 1, electrodes which are in contact with above and below a piezoelectric film are formed using metal such as tungsten or molybdenum by a vapor phase synthetic method such as a CVD method, a sputtering method, or a vacuum evaporation method. In consideration of cost, simplicity, yield, or the like in commercialization of a MEMS, a tungsten film or a molybdenum film is preferably formed by using a sputtering method.

SUMMARY OF THE INVENTION

However, when a metal film such as a tungsten film and a molybdenum film is formed by a sputtering method, such metal is easily grown in a needle-like crystal in a direction perpendicular to a substrate.

FIGS. 12A and 12B show a scanning electron microscope (SEM) photograph which shows a broken-out section of a layer formed of a molybdenum film and a tungsten film which have a thickness of 400 nm by a sputtering method over a substrate respectively. FIG. 12A is a molybdenum film. FIG. 12B is a tungsten film. It is observed that a crystal with a width of about 30 nm, which is small in size, is grown in a needle-like shape in FIG. 12A, whereas a crystal with a width of about 50 mm, which is small in size, is grown in a needle-like shape in FIG. 12B.

Each crystal grain boundary of the molybdenum film and the tungsten film is weak and such a needle-like crystal is weak in shear stress of the direction of the crystal orientation. Therefore, when a structure formed using a tungsten film or a molybdenum film by a sputtering method as a movable portion such as a MEMS switch is used as it is, the structure is immediately broken; therefore, the structure formed using the tungsten film or the molybdenum film is unsuitable for a structure.

In particular, when a metal layer such as a molybdenum film or a tungsten film is formed over the substrate by a sputtering method at a relatively low temperature such that a glass substrate or a plastic substrate is not melted, the metal layer is easily grown in a needle-like shape. Therefore, in the case where the metal layer is formed over a glass substrate or a plastic substrate by a sputtering method, since the metal layer is required to be formed at a relatively low temperature, a problem of breakage of a structure becomes apparent when such a metal layer is used as the structure.

In view of the problems described above, an object of the present invention is to improve strength against breakage of a metal layer such as a molybdenum film or a tungsten film which is used as a microstructure of a microelectromechanical system.

According to the present invention, a metal layer such as a tungsten film or a molybdenum film is used as a structural layer which is used for a microstructure, and the metal layer is irradiated with a laser beam.

According to the present invention, a sacrificial layer is formed over a substrate. A metal film is formed over the sacrificial layer. The metal film is irradiated with a laser beam. The metal film is processed into a predetermined shape to form a metal layer. The sacrificial layer is removed.

In this manner, a metal layer having a plate-like crystal can be obtained. In other words, the metal layer in which a needle-like crystal is reduced or removed can be obtained. Therefore, a microelectromechanical system which is strong against breakage can be obtained by using this metal layer as a structural layer of the microstructure.

According to the present invention, a metal material selected from Ti, Ta, Pt, or Ag, as well as W or Mo, or an alloy containing the metal material as a main component can be used as the metal film.

According to the present invention, the metal film is formed by a sputtering method.

According to the present invention, a sacrificial layer is formed over a substrate. A first layer is formed over the sacrificial layer. The first layer is irradiated with a laser beam to be a second layer. The second layer is processed into a predetermined shape. The sacrificial layer is removed.

According to the present invention, a lower electrode is formed over a substrate. A sacrificial layer for covering the lower electrode is formed. A first conductive film for covering the sacrificial layer is formed. The first conductive film is irradiated with a laser beam. A second conductive film is formed over the first conductive film. Each of the first conductive film and the second conductive film is processed into a predetermined shape to form a first conductive layer and a second conductive layer which serve as an upper electrode. The sacrificial layer is removed.

According to the present invention, a lower electrode is formed over a substrate. A sacrificial layer for covering the lower electrode is formed. A first conductive film for covering the sacrificial layer is formed. The first conductive film is irradiated with a laser beam. A second conductive film is formed over the first conductive film. The second conductive film is irradiated with a laser beam. Each of the first conductive film and the second conductive film is processed into a predetermined shape to form a first conductive layer and a second conductive layer which serve as an upper electrode. The sacrificial layer is removed.

In this manner, the upper electrode including the first conductive film in which a crystal is grown in a plate-like shape, that is, the first conductive film in which a needle-like crystal is reduced or removed, can be obtained. Therefore, a microelectromechanical system which is hard to breakage can be obtained by using this upper electrode as the structural layer of the microstructure.

According to the present invention, a sacrificial layer is formed over a substrate. A first conductive film for covering the sacrificial layer is formed. The first conductive film is irradiated with a laser beam. A piezoelectric thin film is formed over the first conductive film. A second conductive film is formed over the piezoelectric thin film. Each of the piezoelectric thin film and the second conductive film is processed into a predetermined shape. The sacrificial layer is removed.

According to the present invention, a sacrificial layer is formed over a substrate. A first conductive film for covering the sacrificial layer is formed. The first conductive film is irradiated with a laser beam. A piezoelectric thin film is formed over the first conductive film. A second conductive film is formed over the piezoelectric thin film. The second conductive film is irradiated with a laser beam. Each of the piezoelectric thin film and the second conductive film is processed into a predetermined shape. The sacrificial layer is removed.

In this manner, the first conductive film having a plate-like crystal can be obtained. That is, a needle-like crystal of the first conductive film can be reduced or removed. Therefore, an FBAR filter which is strong against breakage can be obtained by using the first conductive film as a structural layer of a microstructure.

According to the present invention, a metal material selected from W, Mo, Ti, Ta, Pt, or Ag, or an alloy containing the metal material as a main component is used as the first conductive film.

According to the present invention, the first conductive film is formed by a sputtering method.

According to the present invention, a metal material selected from W, Mo, Ti, Ta, Pt, or Ag, or an alloy containing the metal material as a main component is used as the second conductive film.

According to the present invention, the second conductive film is formed by a sputtering method.

According to the present invention, any one selected from zinc oxide, aluminum nitride, lead zirconate titanate (PZT), barium titanate, or tantalum oxide is used as the piezoelectric thin film.

According to the present invention, a semiconductor film is formed over a substrate. The semiconductor film is processed into a predetermined shape to form a first semiconductor layer and a second semiconductor layer. A gate insulating film for covering the first semiconductor layer is formed. A first conductive film is formed over the gate insulating film and the second semiconductor layer. The first conductive film is irradiated with a laser beam. The first conductive film is processed into a predetermined shape to form a gate electrode overlapped with the first semiconductor layer with the gate insulating film interposed therebetween, and a first conductive layer over the second semiconductor layer. An interlayer insulating film is formed over the first semiconductor layer, the gate insulating film, and the gate electrode. A piezoelectric thin film is formed over the first conductive layer. A contact hole which reaches the first semiconductor layer is formed in the interlayer insulating film. A second conductive film is formed over the interlayer insulating film and the piezoelectric thin film. Each of the second conductive film and the piezoelectric thin film is processed into a predetermined shape to form a source electrode and a drain electrode which are electrically connected to the first semiconductor layer over the interlayer insulating film, and to form a second conductive layer and a piezoelectric thin film pattern over the first conductive layer. The second semiconductor layer is removed to form a semiconductor element and a microstructure.

According to the present invention, any one selected from a glass substrate, a plastic substrate, a quartz substrate, or a silicon substrate is used as the substrate.

According to the present invention, a YAG laser is used for laser irradiation.

According to the present invention, a microstructure is formed by the manufacturing method described above.

According to the present invention, a microelectromechanical system includes a microstructure formed by the manufacturing method described above.

Note that in this specification, a microelectromechanical system means general devices using a MEMS. In addition, a microstructure means a spatial structure which uses a spatial region and is movable in the microelectromechanical system. Further, a structural layer means a member which is used for a movable portion of the microstructure.

According to the present invention, a needle-like crystal in a structural layer is reduced or removed by laser irradiation, so that a microstructure which is strong against breakage can be obtained. For example, when a structural layer oscillating up and down is irradiated with a laser beam, since crystal grain boundaries which exist in the same direction as a direction to which stress applies are reduced or removed to become a plate-like crystal, the structural layer is hard to be destroyed. By using a microstructure including this structural layer, a microelectromechanical system which is excellent in a resistance property and excellent in reliability can be provided. Note that a microstructure according to the present invention can be used in various fields related to a MEMS, and for example, the microstructure can be used as a sensor such as an acoustic wave sensor, a position sensor, a magnetic sensor, a chemical sensor, a gas sensor, or a humidity sensor. In addition, the microstructure can be applied to a resonator, a micro gear, a generator or the like.

BRIEF DESCRIPTION OF THE DRAWINGS

FIGS. 3A to 3F illustrate a manufacturing process of a microstructure of the present invention.

FIGS. 7A to 7F illustrate a manufacturing process of a microstructure of the present invention.

DETAILED DESCRIPTION OF THE INVENTION

Embodiment Mode

Figure 1:
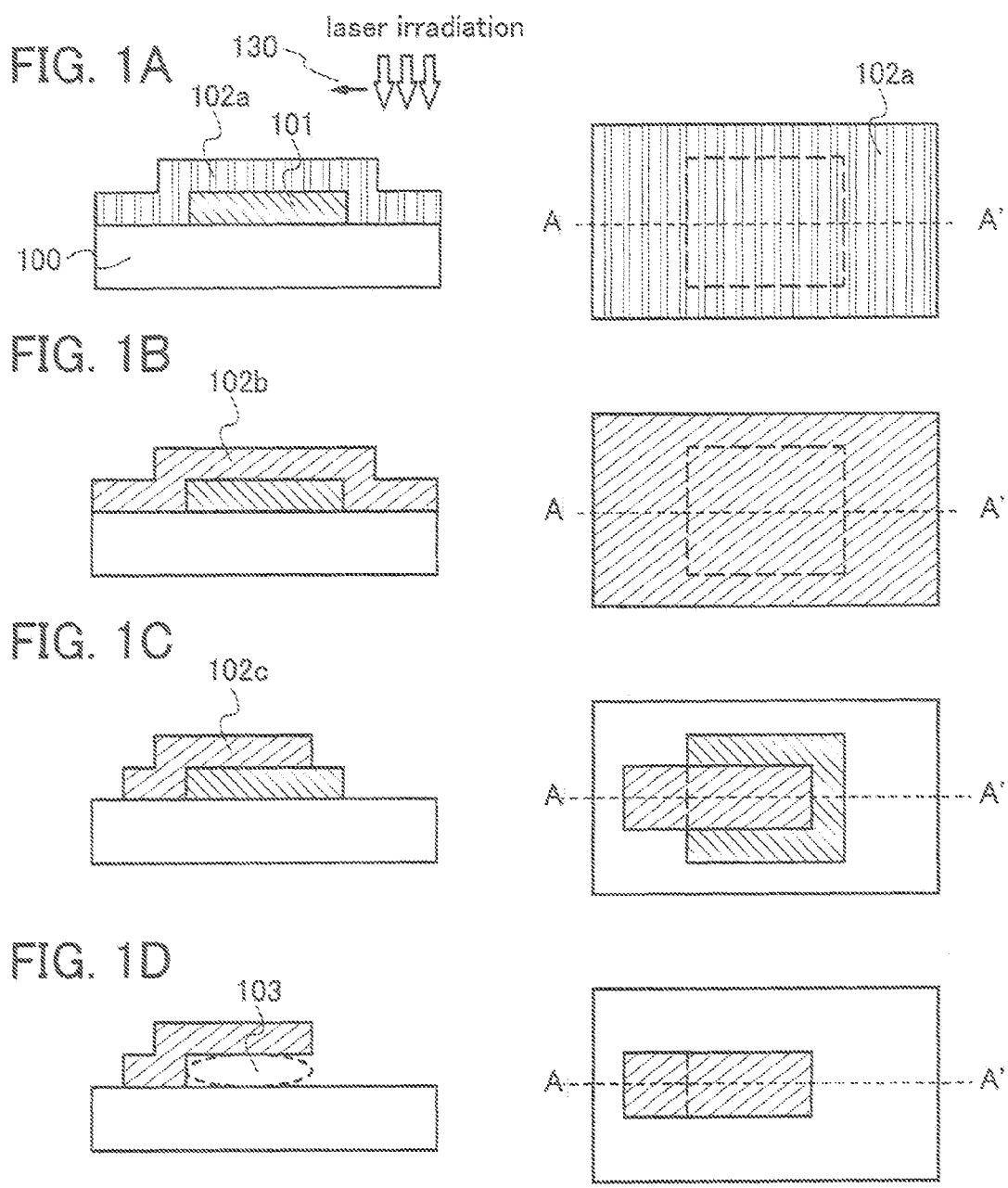
FIGS. 1A to 1D illustrate a manufacturing process of a microstructure of the present invention.

Hereinafter, embodiment modes of the present invention will be described with reference to the drawings. However, it is to be easily understood by those skilled in the art that the present invention can be implemented in many different ways, and modes and details herein disclosed can be modified in various ways without departing from the purpose and the scope of the present invention. Therefore, the present invention should not be interpreted as being limited to the description of the embodiment modes to be given below. Through the drawings of the embodiment modes, the same components or components having the same functions are denoted by the same reference numerals and will not be further explained.

Embodiment Mode 1

In this embodiment mode, a manufacturing method of a microstructure in which a crystalline state of a structural layer is changed by laser irradiation is described.

A substrate 100 is prepared as shown in FIG. 1A. Note that respective cross-sectional views shown on the left side of FIGS. 1A to 1D correspond to dotted lines A-A' of top plan views shown on the right side respectively.

A quartz substrate, a glass substrate, a plastic substrate, a silicon substrate, or the like can be used as the substrate 100. For example, by forming a microstructure over a plastic substrate, a device having a thin, lightweight, and highly flexible microstructure can be formed. In addition, by thinning a quartz substrate, a glass substrate, or a silicon substrate by polishing, a thin microstructure can be formed.

Next, a sacrificial layer 101 is formed over the substrate 100. Note that the sacrificial layer means a layer which is selectively removed in a later step. Therefore, the sacrificial layer may be either a conductive layer or an insulating layer as long as it can be removed. By removing such a sacrificial layer, a space is produced between the substrate 100 and a structural layer formed over the sacrificial layer in a later step. That is, the structural layer which has a spatial shape can be formed.

The sacrificial layer 101 can be formed by a CVD method or a sputtering method, for example. The sacrificial layer 101 can be formed by using a semiconductor layer containing silicon such as amorphous silicon or polysilicon; a material containing metal such as aluminum (Al); an organic layer such as polyimide or resist; an insulating layer such as silicon oxide or a silicon nitride, or the like. Note that the sacrificial layer 101 may have a single layer structure or a stacked structure. In the case of a stacked structure, the aforementioned materials may be combined as appropriate and stacked.

Then, the sacrificial layer 101 can be processed by forming a photoresist mask by photolithography and performing dry etching thereto. In addition, the sacrificial layer 101 can be formed by a droplet discharge method typified by an inkjet method. In the case of using a droplet discharge method, the sacrificial layer 101 can be formed selectively. Therefore, a photolithography process and an etching process of the sacrificial layer 101 can be omitted. As a result, waste of resist materials and the process time can be reduced. In any event, the sacrificial layer is formed using a material which can be selectively etched with respect to a structure.

In this embodiment mode, the sacrificial layer 101 is deposited using silicon oxide by a CVD method, and then the sacrificial layer 101 is formed by processing into a rectangular shape by photolithography.

Next, a first metal film 102a is formed over the sacrificial layer 101 by a sputtering method. The first metal film 102a can be formed by using a metal material selected from tungsten (W), molybdenum (Mo), titanium (Ti), tantalum (Ta), platinum (Pt), and silver (Ag); or an alloy containing the metal material as its main component, for example. Note that the alloy preferably has a state in which two or more elements are mixed together and the whole is a uniform solid phase. In this case, the first metal film 102a is easily etched. Note that the metal film 102a may have a single layer structure or a stacked structure. In the case of the stacked structure, a material which is selected as appropriate from the materials as described above may be stacked.

Next, the first metal film 102a is irradiated with a laser beam (FIG. 1A). The first metal film 102a has a structure including many crystals grown in needle-like shapes. Therefore, laser irradiation is performed, and the needle-like crystals are changed into plate-like crystals by once being melted and recrystallized. Note that an arrow 130 denotes a laser scanning direction.

A continuous wave laser beam (hereinafter referred to as a CW laser beam) or a pulsed wave laser beam (hereinafter referred to as a pulsed laser beam) can be used in the case of the laser irradiation. One or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser can be used. By irradiation with a laser beam of a fundamental wave of such a laser beam or a second harmonic to a fourth harmonic of the fundamental wave, crystal grain boundaries formed in a direction perpendicular to a substrate can be reduced or eliminated. Then, while being irradiated with a laser beam, a metal film formed using the plate-like crystal which is extended in the scanning direction can be obtained.

Note that a fundamental wave of a CW laser beam and a high harmonic of a CW laser beam may be used for irradiation, or a fundamental wave of a CW laser beam and a high harmonic of a pulsed laser beam may be used for irradiation. By using a plurality of laser beams for irradiation in this manner, the energy can be compensated.

It is also possible to use a pulsed laser beam which oscillates at a repetition rate at which after a metal film is melted by a laser beam, the next pulse is emitted and irradiates the metal film before the metal film hardens again. By irradiating a laser beam at such a repetition rate, crystal grain boundaries formed in a structure in the direction perpendicular to the substrate are reduced or eliminated, and crystal grains which have grown in the scanning direction of a laser can be obtained. As a specific repetition rate of a laser beam, a repetition rate of 10 MHz or more is used, which is much higher than the normally used frequency band which is in the range of several ten to several hundred Hz.

In this embodiment mode, a tungsten film of about 400 nm is formed as the first metal film 102a over a quartz substrate for example, and irradiation of a YAG laser ($\lambda=1064$ nm) is performed under the conditions of an output of 150 W and a scan rate of 100 mm/sec.

By performing laser irradiation, the first metal film 102a is recrystallized, and a second metal film 102b having a plate-like or bulk-like shape in which a needle-like crystal is reduced or eliminated can be obtained (FIG. 1B).

Figure 2:
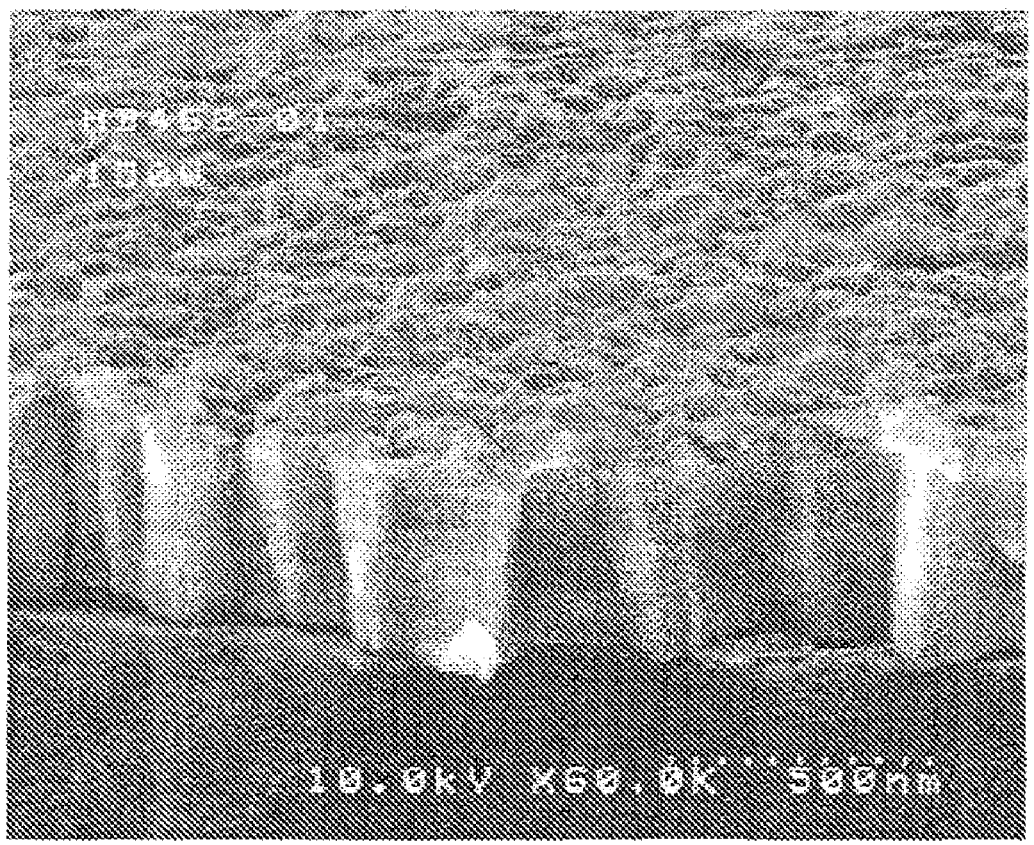
FIG. 2 illustrates one form of a light-emitting device of the present invention.

FIG. 2 shows a scanning electron microscope (SEM) photograph in which a broken-out section of the tungsten film having been irradiated with a laser beam under the above condition is observed. Compared with a state before laser irradiation (FIG. 12B), a needle-like crystal having a width of about 50 nm disappears, and a plate-like crystal having a width of about 150 to 350 nm is obtained.

Note that instead of laser irradiation, irradiation of light emitted from a lamp (also called lamp anneal or lamp heating) may be performed. For example, since a wavelength of halogen lamp light has a peak of a radiation spectrum at about 1000 nm, the wavelength of halogen lamp light is hard to be absorbed by a glass substrate. Therefore, a metal layer can be selectively provided with energy and heated. Note that as lamp light which is used for lamp heating, one or plural kinds selected from a halogen lamp, a metal halide lamp, a xenon lamp, a carbon lamp, a high pressure sodium lamp, and a high pressure mercury lamp can be used, and heating can be performed by radiant light of them.

Next, by using a mask (not shown) formed over the second metal film 102b, the second metal film 102b is processed into a predetermined shape, and thus a metal layer 102c functioning as a structural layer of a microstructure is formed (FIG. 1C). A wet etching method or a dry etching method can be applied to processing. For example, an organic material or an inorganic material can be used as the mask.

Then, the mask is removed, and a microstructure can be obtained by removing the sacrificial layer 101 (FIG. 1D).

Note that a wet etching method or a dry etching method can be applied to the removal of the sacrificial layer 101.

When silicon oxide ($SiO_2$) is used for the sacrificial layer 101, the sacrificial layer 101 can be removed by wet etching with the use of Buffered Hydrogen Fluoride (BHF) in which 49% of hydrofluoric acid solution and ammonium fluoride are mixed at a ratio of 1 to 7. In addition, when polyimide or permanent resist is used for the sacrificial layer 101, the sacrificial layer 101 can be removed by ashing.

In drying after the wet etching, an organic solvent with low viscosity (e.g., cyclohexane) is preferably used for rinsing, in order to prevent the microstructure from deforming such as bending. Alternatively, drying may be performed under the conditions of a low temperature and low pressure, or both of them may be performed in combination.

As a further alternative, the sacrificial layer 101 can be removed by a dry etching method using at least one of $O_2$, $F_2$, and $XeF_2$ under a high-pressure condition such as the atmospheric pressure. In order to prevent the microstructure from deforming such as the bending, it is preferable to perform plasma treatment so that the surface of the microstructure may have a water-repellent property.

When the sacrificial layer 101 is removed in this manner, a space 103 is produced. By utilizing the space 103, the metal layer 102c to be a structural layer can move up and down or from side to side. Thus, the structural layer can function as a switch by a contact of a movable edge of the metal layer 102c with the other electrode. A microstructure having such a shape is called a cantilever microstructure. When this microstructure is used as a switch, operation with few losses and lower power can be performed.

Note that when the thickness of the sacrificial layer 101 is too thick, the interval of the space 103 which is formed between the substrate 100 and the metal layer 102c becomes large and the microstructure is hard to be driven. On the other hand, when the thickness of the sacrificial layer 101 is too thin, an etchant is hard to diffuse, and the sacrificial layer 101 is not etched in a desired shape. In addition, a structural layer is bent or deformed to some extent, which makes the structural layer contact with an object provided below. Therefore, the thickness of the sacrificial layer 101 is preferably in the range from 0.5 to 5 μm, inclusive.

Although the microstructure described in this embodiment mode can be used as a switch, the microstructure can be used as a probe of a scanning tunnel microscope (STM) or scanning atomic force microscopy (AFM), an acceleration sensor, or an angular velocity sensor in addition to a switch.

The microstructure formed by a manufacturing method described in this embodiment mode as mentioned above is strong against breakage and excellent in a resistance property since the microstructure uses a structural layer in which a needle-like crystal is reduced or eliminated and which has a crystal grown in a plate-like shape. Therefore, a microelectromechanical system having this microstructure is superior in reliability.

Embodiment Mode 2

In this embodiment mode, a bridge-type microstructure switch to which a manufacturing method according to the present invention is applied is described with reference to FIGS. 3A to 3F. Note that in this embodiment mode, a microstructure can be driven by electrostatic attraction. Note that cross-sectional views on the left side of FIGS. 3A to 3F correspond to dotted lines A-A' of top plan views of the right side.

First, a first conductive layer 201 functioning as a lower electrode is formed over a substrate 200. The first conductive layer 201 is formed using a metal material selected from W, Mo, Ti, Ta, Pt or Ag, an alloy containing the metal material as its main component, or a material having conductivity by a sputtering method, for example, and etched into a predetermined shape. The first conductive layer 201 can be used as a common electrode, a control electrode or the like.

A sacrificial layer 202 is processed into a predetermined shape by photolithography over the first conductive layer 201 (FIG. 3B).

Figure 12A:
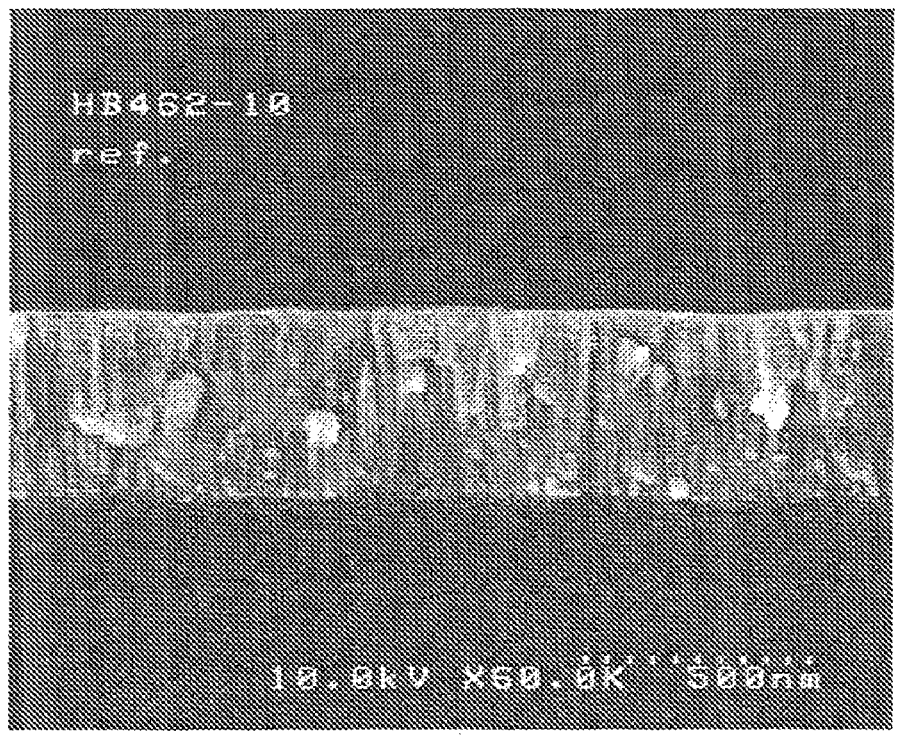
FIGS. 12A and 12B are each a cross-sectional SEM photograph of a structural layer which is used for a microstructure formed by a sputtering method.
Figure 12B:
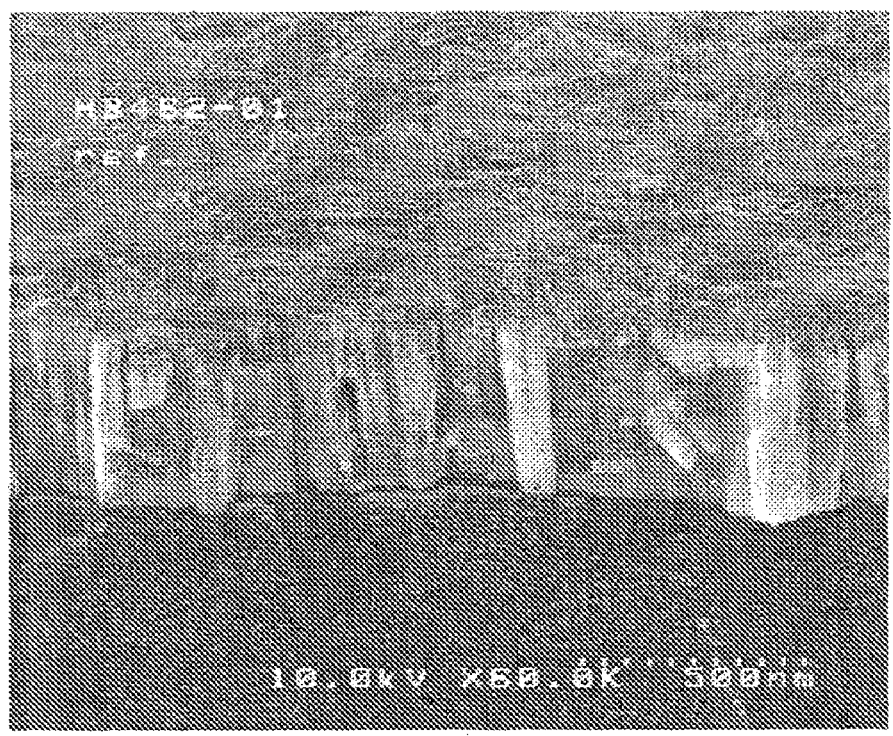

A first conductive film 203a to be a part of an upper electrode 202 is formed over the sacrificial layer 202 by a sputtering method. As the first conductive film 203a, a metal film containing a metal material selected from W, Mo, Ti, Ta, Pt or Ag, or an alloy containing the aforementioned metal material as its main component can be used for example. The thickness of the first conductive film 203a is in the range from 200 nm to 3 μm, inclusive, and preferably in the range from 400 nm to 1 μm, inclusive. The formed first conductive film 203a is a needle-like crystal which is grown in a direction perpendicular to a substrate as shown in FIGS. 12A and 12B.

Next, the first conductive film 203a is irradiated with a laser beam (FIG. 3C). Here, an arrow 230 denotes a laser scanning direction. The kind of a laser, an irradiation condition and the like may be referred to Embodiment Mode 1.

By performing laser irradiation, once the first conductive film 203a is melted, and a second conductive film 203b in which the needle-like crystal is reduced or eliminated and which has a plate-like or bulk-like crystal in which a grain size is coarse is formed.

Next, a third conductive film 204a is stacked over the second conductive film 203b (FIG. 3D). Then, by using a mask (not shown) formed over the third conductive film 204a, the second conductive film 203b and the third conductive film 204a each are processed into a predetermined shape, and a second conductive layer 203c and a third conductive layer 204b which serve as an upper electrode are formed (FIG. 3E). As the third conductive layer 204b, a metal layer formed by using a metal material selected from W, Mo, Ti, Ta, Pt, Ag or the like, or using an alloy containing the metal material as its main component can be used. Needless to say, the third conductive film 204a may be irradiated with a laser beam. Note that an insulating film may be formed instead of the third conductive film 204a or formed over the third conductive film 204a.

Next, as shown in FIG. 3F, the sacrificial layer 202 is removed by a wet etching method or a dry etching method, and thus a microstructure is formed. When silicon oxide ($SiO_2$) is used for the sacrificial layer 202, the sacrificial layer 202 can be removed by wet etching with the use of Buffered Hydrogen Fluoride (BHF) in which 49% of hydrofluoric acid solution and ammonium fluoride are mixed at a ratio of 1 to 7. In addition, when polyimide or permanent resist is used for the sacrificial layer, the sacrificial layer 202 can be removed by ashing.

In drying after the wet etching, an organic solvent with low viscosity (e.g., cyclohexane) may be used for rinsing, in order to prevent the microstructure from deforming such as buckling or bending. Alternatively, drying may be performed under the conditions of a low temperature and low pressure, or both of them may be performed in combination.

As a further alternative, the sacrificial layer 202 can be removed by a dry etching method using at least one of $O_2$, $F_2$, and $XeF_2$ under a high-pressure condition such as the atmospheric pressure. In order to prevent the microstructure from deforming such as buckling or bending, it is preferable to perform plasma treatment so that the surface of the microstructure may have a water-repellent property.

When the sacrificial layer 202 is removed in this manner, a space 205 is produced. By utilizing the space 205, a microstructure functioning as a bridge-type switch in which the second conductive layer 203c and the third conductive layer 204b which are used as an upper electrode can move up and down can be formed. In this embodiment mode, the upper electrode serves as a structural layer.

Note that in a switch according to the present invention, a film using a material having a higher conductivity than a material for the second conductive layer 203c may be formed over the sacrificial layer 202, and the second conductive layer 203c and the third conductive layer 204b may be formed thereover. Similarly, a film using a material having a higher conductivity than a material for the first conductive layer 201 may be further provided over the first conductive layer 201 which serves as a lower electrode. Such a conductive film can reduce abrasion of an electrode of a microstructure as well as reducing contact resistance between an upper electrode and a lower electrode. Au, Ru, or an alloy containing them as its main component can be used as a film provided over the first conductive layer 201. In addition, Au, Ru, or an alloy containing them as its main component can be used as a film provided over the sacrificial layer 202 before forming the second conductive layer 203c. Note that Au, Ru, or an alloy containing them as its main component may be provided only on a portion where the first conductive layer 201 and the second conductive layer 203c are contact with each other. Since Au, Ru, or an alloy containing them as its main component has high electric conductivity and is flexible metal, Au or Ru, or the alloy containing them as its main component is effective in suppressing a contact failure.

The microstructure according to this embodiment mode as mentioned above is strong against breakage and excellent in a resistance property since a structural layer stacking the third conductive layer 204b and the second conductive layer 203c in which a needle-like crystal is reduced or eliminated and which has a plate-like crystal is formed as an upper electrode. Therefore, a microelectromechanical system having this microstructure can be superior in reliability.

Figure 4A:
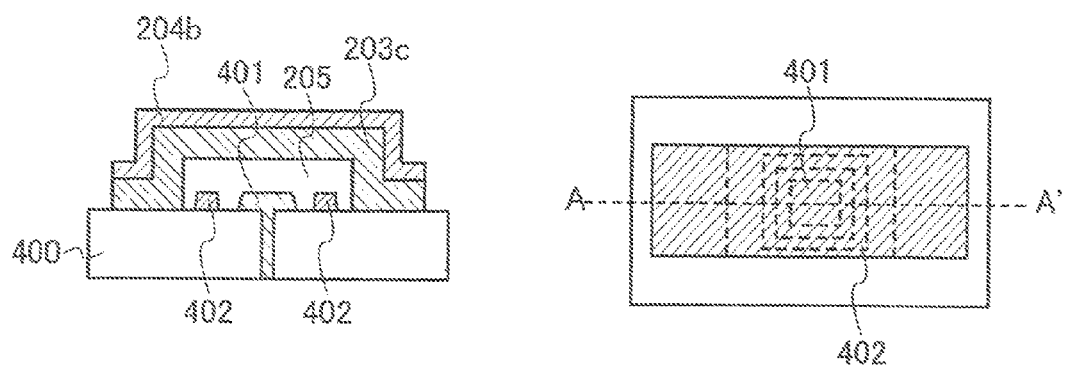
FIGS. 4A and 4B each illustrate a microstructure of the present invention.
Figure 4B:
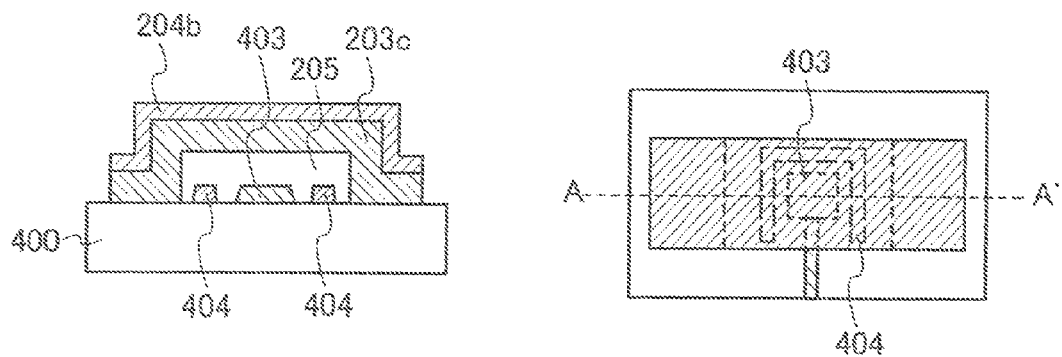

In addition, FIGS. 4A and 4B each show an example in which a microstructure functioning as a bridge-type switch is further provided with an electrode functioning as a control electrode. Note that cross-sectional views shown on the left side of FIGS. 4A and 4B each correspond to dotted lines A-A' of top views shown on the right side.

In FIG. 4A, a controlling electrode 402 is formed so as to surround the periphery of a first conductive layer 401 which serves as a lower electrode and which is formed over a layer 400 supporting a microstructure. In this case, a terminal electrode connected to the lower electrode is provided under the lower electrode through a contact hole formed in the layer 400. In FIG. 4B, a controlling electrode 404 is formed adjacent to at least two sides (an example covering three sides is shown here) of a first conductive layer 403 which serves as a lower electrode. In this case, a region where the first conductive layer 403 is not surrounded by the controlling electrode 404 can be provided with a terminal electrode connected to the first conductive layer 403 which serves as a lower electrode. Note that as shown in FIG. 4A, the terminal electrode can be provided under the lower electrode through the contact hole formed in the layer 400.

A selection signal whether the second conductive layer 203c and the third conductive layer 204b which are the upper electrode are selected or not is inputted to the controlling electrodes 402 and 404. When the selection signal is inputted, electrostatic attraction is generated between the upper electrode and the controlling electrodes 402 and 404, the upper electrode can come down, contact with the lower electrode, and function as a switch. Since the controlling electrodes 402 and 404 are provided adjacent to at least two sides of the lower electrode, areas of the controlling electrodes 402 and 404 can be made large. Therefore, the electrostatic attraction can occur between the upper electrode and the controlling electrodes 402 and 404 by a relatively low voltage. In addition, reliability of a switch function can be improved.

In this embodiment mode, a structure, a material, a manufacturing condition, or the like of an electrode and a conductive layer can be freely combined with the aforementioned embodiment mode as appropriate when possible.

Embodiment Mode 3

In this embodiment mode, a Film Bulk Acoustic Resonator (FBAR) filter to which a manufacturing method according to the present invention is applied is described with reference to FIGS. 5A to 5D.

An FBAR is a kind of an RF-MEMS device formed using a semiconductor process technique, and a filter body is constituted by a piezoelectric thin film and an electrode provided above and below the piezoelectric thin film. Frequency is determined by mechanical vibration of this portion. The FBAR filter according to this embodiment mode can be operated at a high frequency band above 10 GHz and also be applied to a mobile phone.

Figure 5A:
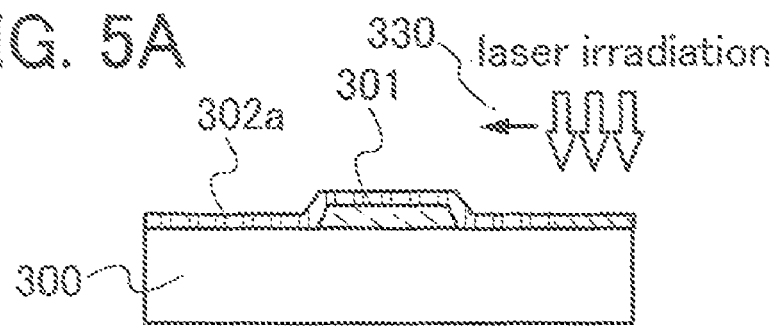
FIGS. 5A to 5D illustrate a manufacturing process of a microstructure of the present invention.

A sacrificial layer 301 is formed over a substrate 300 as shown in FIG. 5A. A quartz substrate, a glass substrate, a plastic substrate, a silicon substrate or the like can be used as the substrate 300. For example, by forming a microstructure over a plastic substrate, an FBAR filter which is light, thin and highly flexible can be formed. In addition, by thinning a quartz substrate, a glass substrate, and a silicon substrate by polishing, an FBAR filter can be formed.

The sacrificial layer 301 can be formed by a CVD method or a sputtering method, for example. The sacrificial layer 301 can be formed by using a semiconductor layer containing silicon such as amorphous silicon or polysilicon; a material containing metal such as aluminum (Al); an organic layer such as polyimide or resist; an insulating layer such as silicon oxide or a silicon nitride, or the like. Note that the sacrificial layer 301 may have a single layer structure or a stacked structure. In the case of a stacked structure, the aforementioned materials may be combined as appropriate and stacked.

Next, a first conductive film 302a is formed over the sacrificial layer 301 by a sputtering method. The first conductive film 302a can be formed by using a metal film containing one kind or plural kinds selected from tungsten (W), molybdenum (Mo), titanium (Ti), tantalum (Ta), platinum (Pt), silver (Ag) and the like, an alloy containing the metal as its main component, or the like.

Next, the first conductive film 302a is irradiated with a laser beam (FIG. 5A). Here an arrow 330 denotes a laser scanning direction. The first conductive film 302a has a structure including many crystals grown in needle-like shapes. Therefore, laser irradiation is performed, and the needle-like crystals are changed into plate-like crystals by once being melted and recrystallized. Note that when a substrate with a relatively low melting point such as a plastic substrate is used as the substrate 300, only near the surface of the first conductive film 302a may be melted by laser irradiation and recrystallized. In addition, by forming an insulating film over the substrate 300, heat may be prevented from reaching the substrate 300.

A continuous wave laser beam (hereinafter referred to as a CW laser beam) or a pulsed wave laser beam (hereinafter referred to as a pulsed laser beam) can be used in the case of the laser irradiation. One or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser can be used. By irradiation with a laser beam of a fundamental wave of the above laser beam or a second harmonic to a fourth harmonic of the fundamental wave, crystal grain boundaries formed in a direction perpendicular to the substrate can be reduced or eliminated. Then, while being irradiated with a laser beam, a metal film formed using the plate-like crystal which is extended in the scanning direction can be obtained.

Note that a fundamental wave of a CW laser beam and a high harmonic of a CW laser beam may be used for irradiation, or a fundamental wave of a CW laser beam and a high harmonic of a pulsed laser beam may be used for irradiation. By using a plurality of laser beams for irradiation in this manner, the energy can be compensated.

It is also possible to use a pulsed laser beam which oscillates at a repetition rate at which after the first conductive film 302a is melted by a laser beam, the next pulse is emitted and irradiates the first conductive film 302a before the first conductive film 302a hardens again. By irradiating a laser beam at such a repetition rate, crystal grain boundaries formed in a structure in the direction perpendicular to the substrate are reduced or eliminated, and plate-like or bulk-like crystal grains which have grown in the scanning direction of a laser can be obtained. As a specific repetition rate of a laser beam, a repetition rate of 10 MHz or more is used, which is much higher than the normally used frequency band which is in the range of several ten to several hundred Hz.

In this embodiment mode, a molybdenum film with a thickness of about 400 nm is formed as the first conductive film 302a, irradiation of a YAG laser ($\lambda$=1064 nm) is performed under the conditions of an output of 150 W and a scan rate of 500 mm/sec.

By performing laser irradiation, the first conductive film 302a is recrystallized, and a first electrode 302b which has a plate-like crystal and in which a needle-like crystal is reduced or eliminated can be obtained without heating the substrate to a vicinity of a melting point of the substrate.

Next, a piezoelectric thin film 303a is formed over the first electrode 302b. The piezoelectric thin film 303a is constituted by a film having a piezoelectric property such as zinc oxide (ZnO), aluminum nitride (AlN), lead zirconate titanate (PZT), barium titanate ($BaTiO_3$), or tantalum oxide ($Ta_2O_5$), and for example, the film is formed with a thickness in the range from 0.1 to 1 μm, inclusive. Note that ZnO, AlN, or the like can be formed by a sputtering method for example, and PZT can be formed, for example, by being formed a sol-gel method, sintered, and then polarized. The polarized process is performed by applying a direct electric field in the range from 200 to 300° C. for example.

Figure 5B:
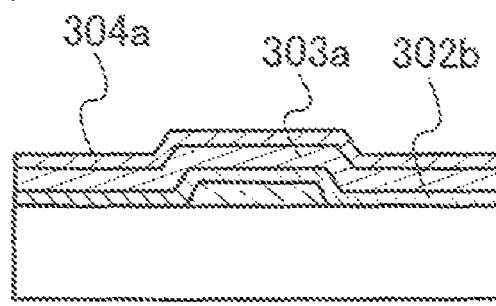

Next, a second conductive film 304a is formed over the piezoelectric thin film 303a by a sputtering method (FIG. 5B). The same material as the first conductive film 302a can be used for the second conductive film 304a.

Figure 5C:
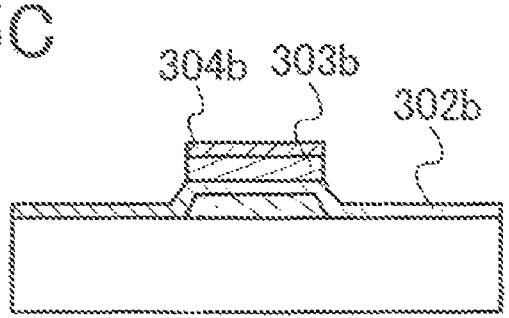

Next, each of the piezoelectric thin film 303a and the second conductive film 304a is processed into a predetermined shape, and a piezoelectric thin film 303b and a second electrode 304b are formed (FIG. 5C). Note that in FIG. 5C, although the second electrode 304b and the piezoelectric thin film 303b have the same shape, the second electrode 304b and the piezoelectric thin film 303b may have different shapes from each other.

Figure 5D:
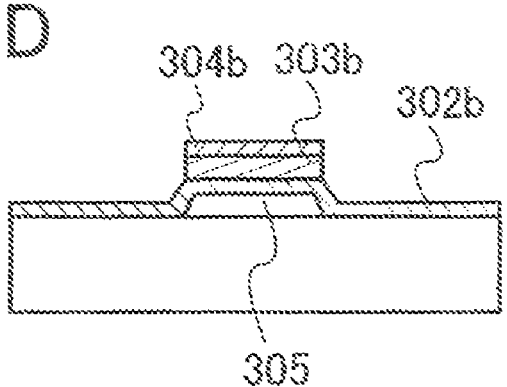

Then, the sacrificial layer 301 is removed by etching (FIG. 5D). The method shown in Embodiment Mode 1 can be applied to the removal of the sacrificial layer 301.

When the sacrificial layer 301 is removed in this manner, a space 305 is produced. By providing the space 305, an FBAR filter including the first electrode 302b, the piezoelectric thin film 303b, and the second electrode 304b can be freely vibrated. Note that wires each connected to the first electrode 302b and the second electrode 304b are not shown.

In this embodiment mode, the first conductive film 302a is irradiated with a laser beam, and needless to say, the second conductive film 304a may be irradiated with a laser beam similarly. In that case, the first electrode 302b and the second electrode 304b are strong against breakage, and a resistance property of the FBAR filter can be improved.

Note that in this embodiment mode, only the second conductive film 304a may be irradiated with a laser beam. In that case, since the first conductive film 302a has a needle-like crystal in a direction perpendicular to the substrate, the piezoelectric thin film 303a formed over the first conductive film 302a is oriented in a direction (a z-axis direction) perpendicular to the substrate by succeeding the crystallinity of the first conductive film 302a. By using the piezoelectric thin film 303b having this high orientation, an FBAR filter, which has few losses and high performance, and which is excellent in a bandwidth and a frequency temperature property, can be formed.

As described above, since a microstructure (an FBAR filter) formed by a manufacturing method described in this embodiment mode uses the structural layer (either or both of the first electrode 302b and the second electrode 304b) in which a crystal is grown in a plate-like shape by laser irradiation and a needle-like crystal is reduced or eliminated, the microstructure is strong against breakage and excellent in a resistance property. Accordingly, a microelectromechanical system having this FBAR filter is superior in reliability.

Embodiment Mode 4

In this embodiment mode, a microelectromechanical system having a microstructure according to the present invention and capable of wireless communication is described.

Figure 6:
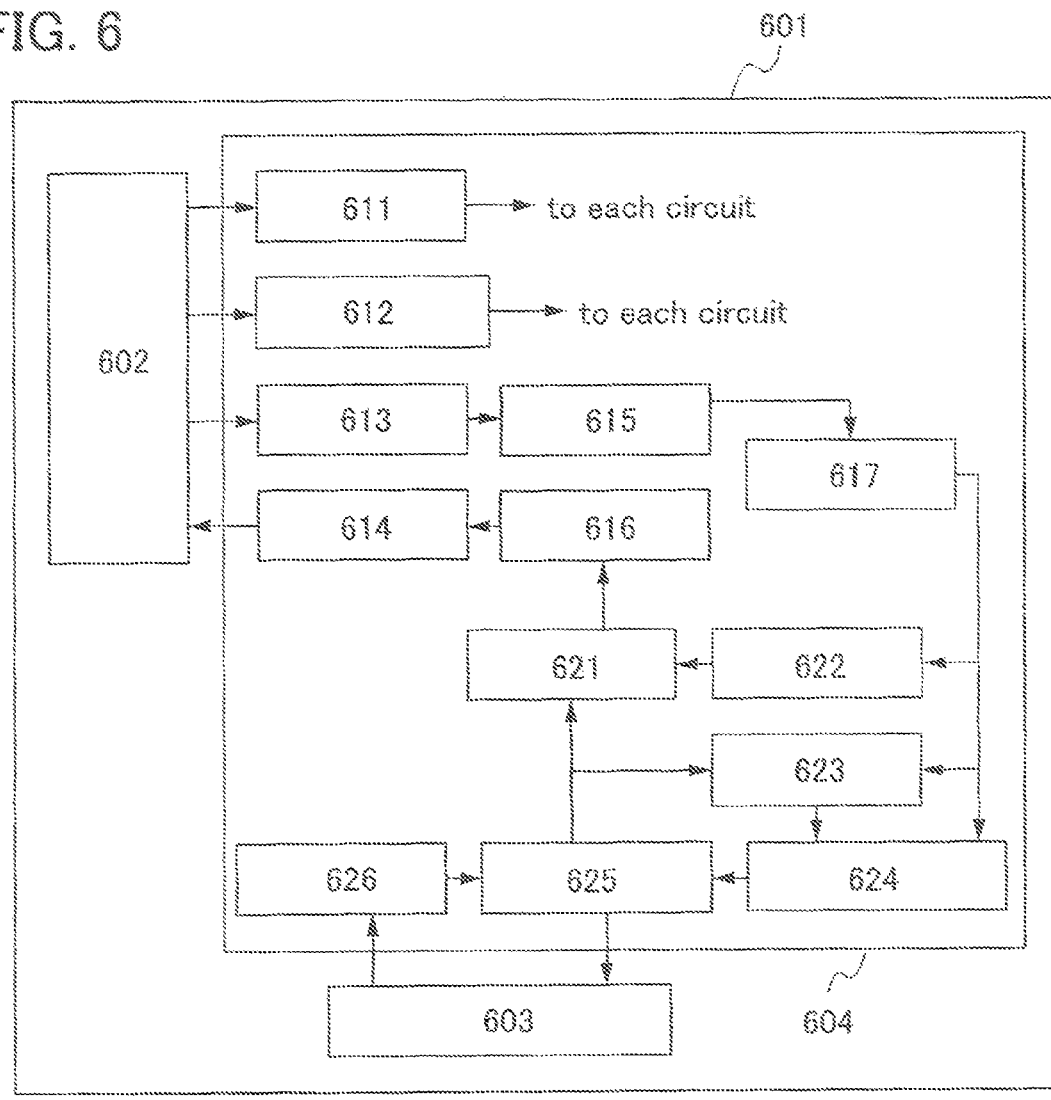
FIG. 6 illustrates a semiconductor device having a microstructure of the present invention.

FIG. 6 shows a detailed structure of an electric circuit 604 of a microelectromechanical system 601. The electric circuit 604 receives an electromagnetic wave emitted from outside (here, corresponding to a reader/writer) to generate electric power for driving the microelectromechanical system 601, and communicates with outside wirelessly. Therefore, the electric circuit 604 has a power source circuit 611, a clock generating circuit 612, a modulation circuit 613, a demodulation circuit 614, a decoding circuit 615, an encoding circuit 616, an information judging circuit 617, and the like, which are necessary for wireless communication. Moreover, in some cases, the semiconductor device has a different structure depending on frequency of electromagnetic wave or a communication method used for the wireless communication.

The electric circuit 604 has functions of controlling a microstructure 603, processing information from the reader/writer, and the like. Therefore, the electric circuit 604 has a memory, a memory controlling circuit, an arithmetic circuit, and the like. FIG. 6 shows a structure in which the electric circuit 604 has a memory 621, a memory controlling circuit 622, an arithmetic circuit 623, a structure controlling circuit 624, an A/D converting circuit 625, and a signal amplifying circuit 626.

The power source circuit 611 has a diode and a capacitor and can hold constant voltage by rectifying alternating voltage generated at the antenna 602 and supply the constant voltage to each circuit. The clock generating circuit 612 has a filter element or a frequency dividing circuit, whereby clock with required frequency can be generated based on the alternating voltage generated at the antenna 602 and the clock can be supplied to each circuit.

Here, frequency of the clock generated by the clock generating circuit 612 is basically set to be equal to or lower than frequency of an electromagnetic wave with which the reader/writer and the microelectromechanical system 601 communicate with each other. Moreover, the clock generating circuit 612 has a ring oscillator and can generate a clock with arbitrary frequency by inputting voltage from the power source circuit 611.

The demodulation circuit 613 has a filter element and an amplifying circuit, so that a signal included in alternating voltage generated at the antenna 602 can be demodulated. The demodulation circuit 613 has a circuit having a different structure depending on a modulation method used for the wireless communication. The decoding circuit 615 decodes a signal which has been demodulated by the demodulation circuit 613. This decoded signal is a signal which has been sent from the reader/writer. The information judging circuit 617 has a comparing circuit and the like, and can judge whether the decoded signal is a correct signal that has been sent from the reader/writer. If the signal is judged to be correct information, the information judging circuit 617 can send a signal showing that the signal is correct to each circuit (such as the memory controlling circuit 622, the arithmetic circuit 623, or the microstructure controlling circuit 624) and the circuit having received the signal can perform predetermined operation.

The encoding circuit 616 encodes data to be sent from the microelectromechanical system 601 to the reader/writer. The modulating circuit 614 modulates the encoded data and sends the modulated data to the reader/writer through the antenna 602.

The data to be sent to the reader/writer is data unique to the microelectromechanical system stored in the memory 621 or data obtained by a function of the microelectromechanical system. The data unique to the microelectromechanical system is data such as identification information stored in a nonvolatile memory included in the microelectromechanical system. The data obtained by a function of the microelectromechanical system is, for example, data obtained by the microstructure, data to which certain calculation has been conducted based on the data obtained by the microstructure, and the like.

The memory 621 can have a volatile memory and a nonvolatile memory and stores data unique to the microelectromechanical system 601, information obtained from the microstructure 603, and the like. Although the drawing shows only one memory 621, it is possible to have a plurality of memories in accordance with the kind of information to be stored and a function of the microelectromechanical system 601. The memory controlling circuit 622 controls the memory 621 in the case of reading information stored in the memory 621 and writing information in the memory 621. Specifically, the memory controlling circuit 622 can generate a writing signal, a reading signal, a memory selecting signal, and the like; specify an address; and the like.

The microstructure controlling circuit 624 can generate a signal for controlling the microstructure 603. For example, in the case of controlling the microstructure 603 in accordance with an instruction from the reader/writer, a signal for controlling the microstructure 603 is generated based on the signal decoded by the decoding circuit 615. In the case where data such as a program for controlling operation of the microstructure 603 is stored in the memory 621, a signal for controlling the microstructure 603 is generated based on the data read from the memory 621. Besides, it is possible to provide a feedback function for generating a signal for controlling the microstructure 603 based on data in the memory 621, data from the reader/writer, and data obtained from the microstructure 603.

The arithmetic circuit 623 can process data obtained from the microstructure 603, for example. Moreover, the arithmetic circuit 623 can perform information processing and the like in the case where the microstructure controlling circuit 624 has a feedback function. The A/D converting circuit 625 is a circuit for converting analog data and digital data and transmits a control signal to the microstructure 603. Alternatively, the A/D converting circuit 625 can convert data from the microstructure 603 and transmit the data to each circuit. The signal amplifying circuit 626 can amplify a weak signal obtained from the microstructure 603 and transmits the amplified signal to the A/D converting circuit 625.

Note that the FBAR filter according to Embodiment Mode 3 can be used as the microstructure 603 according to this embodiment mode. In addition, the microstructure according to Embodiment Mode 1 or 2 can be used as a switch included in the demodulation circuit 613. By using the microstructure according to the present invention as a switch of the demodulation circuit 613, a circuit structure can be made in small size. Needless to say, the microstructure shown in Embodiment Mode 1 or 2 can be used as appropriate as a switch of another circuit.

Such a microelectromechanical system enables wireless communication. The microstructure included in the microelectromechanical system is excellent in a resistance property since a structural layer which is used as a movable portion of the microstructure is irradiated with a laser beam and a crystal is grown in a plate-like and a needle-like crystal is reduced or eliminated. Therefore, a microelectromechanical system having this microstructure is superior in reliability.

Embodiment Mode 5

In this embodiment mode, a manufacturing method of a microelectromechanical system in which a microstructure and a semiconductor element for driving the microstructure are formed on a flat surface is described. Note that here, a case where a top-gate thin film transistor (TFT) is formed as a semiconductor element is described with reference to FIGS. 7A to 8D. Note that in FIGS. 7A to 8D, in order to form a semiconductor element on the left side and a microstructure on the right side, a first region 500a is formed on the left side of each drawing, and a second region 500b is formed on the right side of each drawing.

First, a base film 502 is formed over a substrate 501. A glass substrate, a silicon substrate, a plastic substrate, or the like can be used as the substrate 501. Silicon oxide, silicon nitride, silicon nitride containing oxygen (silicon nitride oxide), silicon oxide containing nitrogen (silicon oxynitride), or the like can be used as the base film 502. Note that the base film 502 may have a stacked structure using some of the materials described above. In this embodiment mode, the base film 502 can be formed using silicon oxide containing nitrogen having a thickness in the range from 50 to 200 nm, inclusive (preferably in the range from 100 to 150 nm, inclusive) by plasma CVD.

A semiconductor film is formed over the base film 502, and processed into a predetermined shape to form semiconductor layers 503a, 503b, and 504 (FIG. 7A). Amorphous silicon, polycrystalline silicon, or silicon germanium can be used as the semiconductor film. In addition, ZnO having a light transmitting property may be used. In this embodiment mode, an amorphous silicon film is formed, and a polycrystalline silicon film which is crystallized by using a catalytic metal element typified by Ni is formed. Such a polysilicon film has high mobility and is appropriate as a semiconductor element. Note that the semiconductor layer 504 of the second region 500b is a sacrificial layer which is removed later.

Since the semiconductor layer of the semiconductor element and the sacrificial layer of the microstructure can be manufactured in the same process, a process can be simplified.

Next, a gate insulating film 505 is formed over the semiconductor layers 503a and 503b of the first region 500a (FIG. 7B). For example, silicon oxide, silicon nitride, silicon oxynitride, or the like can be used as the gate insulating film 505. Further, the gate insulating film 505 may be a single layer or a stacked layer. In the case of a stacked structure, materials selected from the above may be staked. Note that since the gate insulating film 505 is formed only in the first region 500a, a mask 506 is formed in the second region 500b.

The mask 506 is removed, and then a first conductive film 507 is formed. Then, the first conductive film 507 in the second region 500b is irradiated with a laser beam (FIG. 7C). The first conductive film 507 has a structure including many crystals grown in needle-like shapes. Therefore, the first conductive film 507 is irradiated with a laser beam, and the needle-like crystals are changed into plate-like crystals or bulk-like crystals having amorphous or polycrystalline by once being melted and recrystallized. In FIG. 7C, an arrow 530 denotes a laser scanning direction.

After laser irradiation, the first conductive film 507 is processed into a desired shape by photolithography, so that gate electrodes 508a and 508b of the semiconductor element, and a first conductive layer 509 which serves as a lower electrode of the microstructure can be formed (FIG. 7D). The condition of Embodiment Mode 1 can be applied to the laser irradiation.

Note that the first conductive film 507 can be formed by using a conductive material such as one kind or plural kinds selected from tungsten (W), molybdenum (Mo), titanium (Ti), tantalum (Ta), and the like, an alloy containing the material as its main component, or the like, for example. In this embodiment mode, the first conductive film 507 is formed by using a molybdenum film.

Note that in this embodiment mode, the gate electrodes 508a and 508b of the semiconductor element are irradiated with a laser beam. In the case where a fine gate electrode with a submicron width is formed without performing laser irradiation, a period of a metallic crystal is disturbed or a density of the metallic crystal is reduced in grain boundaries between many needle-like crystals included in the gate electrode, so that etching is preferentially made; therefore, variation of etch rate occurs in the direction of the gate electrode side surface. That is, since the width of the gate electrode varies depending on a place, a channel length varies in a channel width direction of a TFT. As miniaturization of the TFT progresses, this problem becomes apparent further. Therefore, by performing laser irradiation according to the present invention, roughness of the side surface of the gate electrode can be reduced, and variation on electric characteristics of the TFT, a threshold voltage, an on-state current, or the like can be reduced.

Next, a mask 510 is provided in the second region 500b, and an impurity element which imparts N-type or P-type conductivity is added into the semiconductor layers 503a and 503b of the semiconductor element, and impurity regions 511a and 511b are formed (FIG. 7E).

Next, the mask 510 is removed, and then an insulating film is formed in the first region 500a and the second region 500b. Then, the insulating film in the second region 500b is etched, so that an interlayer insulating film 512 is formed in the first region 500a (FIG. 7F). The interlayer insulating film 512 can be formed using one or some materials selected from SiN, $SiO_2$, SiON, and SiNO.

Figure 8A:
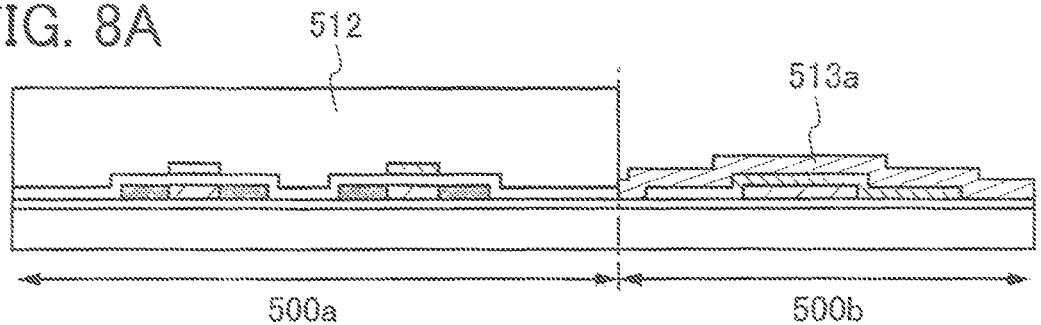
FIGS. 8A to 8D illustrate a manufacturing process of a microstructure of the present invention.

Next, a film having a piezoelectric property is formed in the first region 500a and the second region 500b. The film having the piezoelectric property in the first region 500a is etched, and a piezoelectric thin film 513a is formed in the second region 500b (FIG. 8A). The piezoelectric thin film 513a can be formed using a film having a piezoelectric property such as ZnO, AlN, PZT, $BaTiO_3$, or $Ta_2O_5$, and a thickness of the piezoelectric thin film 513a is in the range from 0.3 to 3 μm, preferably in the range from 1 to 2 μm.

Figure 8B:
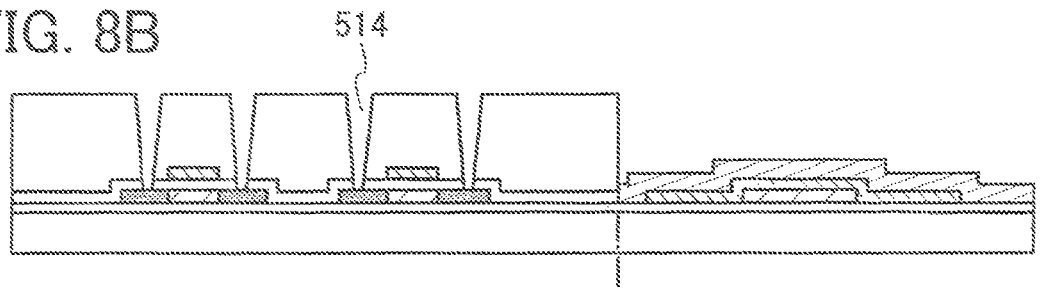
Figure 8C:
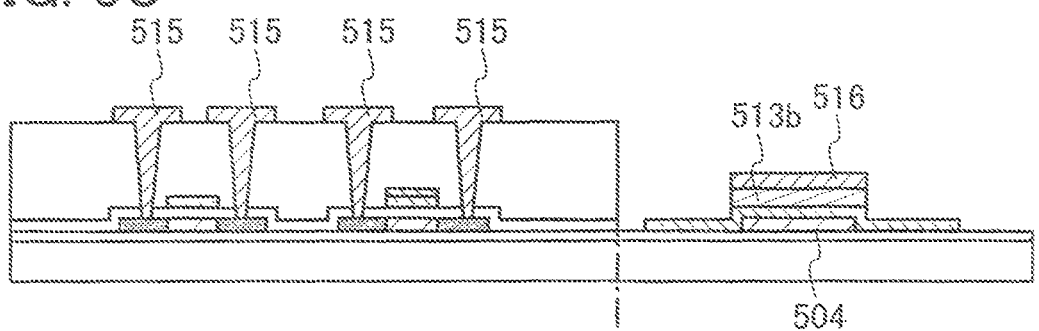

Contact holes 514 which reach the impurity regions 511a and 511b which serve as a source region and a drain region of the semiconductor layers 503a and 503b are formed in the interlayer insulating film 512 (FIG. 8B). Then, a second conductive film is formed by a sputtering method and processed into a predetermined shape by etching, so that a source electrode or a drain electrode 515 connected to the source region or the drain region of the semiconductor element is formed in the first region 500a, whereas a second conductive layer 516 which serves as an upper electrode of the microstructure is formed in the second region 500b. A conductive material which is applied to the first conductive film 507 can be used as the second conductive film. Note that the piezoelectric thin film 513a is also processed at the time of processing of the second conductive film, and a piezoelectric thin film 513b having a predetermined shape is formed (FIG. 8C).

Next the semiconductor layer 504 which is the sacrificial layer is removed. A wet etching method or a dry etching method can be applied to the removal of the sacrificial layer.

Figure 8D:
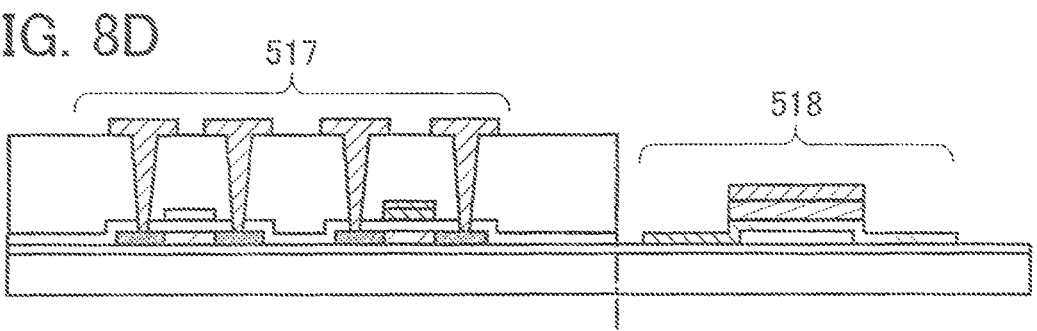

By the process described above, a semiconductor element 517 and a microstructure 518 (referred to as an FBAR filter in this embodiment mode) can be formed in the same process (FIG. 8D). As a result, a manufacturing process of a microelectromechanical system can be simplified. Since the first conductive film 507 which serves as the first conductive layer 509 of the microstructure 518 has a structure including many needle-like crystals, the needle-like crystals can be reduced or eliminated and grown in plate-like crystals by performing laser irradiation according to the present invention. Therefore, shear stress in the direction of the crystal orientation is strengthened, and a microelectromechanical system having a microstructure which is excellent in a resistance property can be obtained.

Note that in this embodiment mode, the first conductive film 507 is irradiated with a laser beam, and needless to say, the second conductive film may also be irradiated with a laser beam.

This embodiment mode can be freely combined as appropriate as long as this embodiment mode can be combined with another embodiment mode.

Embodiment Mode 6

In this embodiment mode, a specific structural example and an example of specific use of the microelectromechanical system having the wireless communication technique described in Embodiment Mode 4 are described with reference to FIGS. 9A and 9B.

Figure 9A:
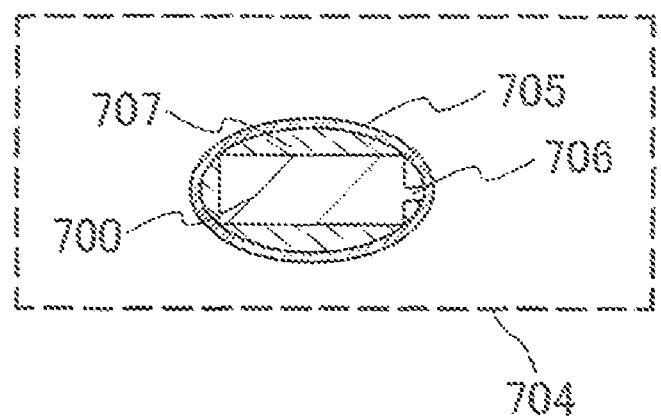
FIGS. 9A and 9B illustrate one form of a microelectromechanical system of the present invention.

A microelectromechanical system 704 shown in FIG. 9A has a capsule 705 coated with a protective layer, in which a region 700 having a microstructure according to the present invention is provided. The region 700 having the microstructure is provided with a discharge opening 706. A space between the capsule 705 and the region 700 having the microstructure may be filled with a filler 707.

The protective layer formed over the surface of the cupsule 705 preferably contains diamond like carbon (DLC), silicon nitride, silicon oxide, silicon nitride oxide, silicon oxynitride, or carbon nitride. A known capsule or filler is used as appropriate as the cupsule 705 or the filler 707. By providing the protective layer for the capsule 705, the microelectromechanical system can be prevented from being melted or changed in property, inside a body.

Besides, by making the outer surface of the capsule have a curved shape, the capsule does not hurt a human body; therefore, the capsule can be used safely.

The microelectromechanical system 704 according to this embodiment mode can be put into a human body and inject a medicine to an area affected by disease. In addition, when the microelectromechanical system 704 is provided with an additional function such as a sensor for detecting biological function data of body by measuring a physical amount and a chemical amount or a sampler for sampling cells in the affected area, the obtained information can be signal-converted and processed by the electrical circuit and be sent to the reader/writer by wireless communication. Depending on the structure of the electrical circuit in the microelectromechanical system, the microelectromechanical system can have an advanced function, such as a function of moving around to seek the area affected by disease based on the information obtained by the microstructure, a function of judging whether the medicine is injected or not, or the like by observing the area affected by disease.

Figure 9B:
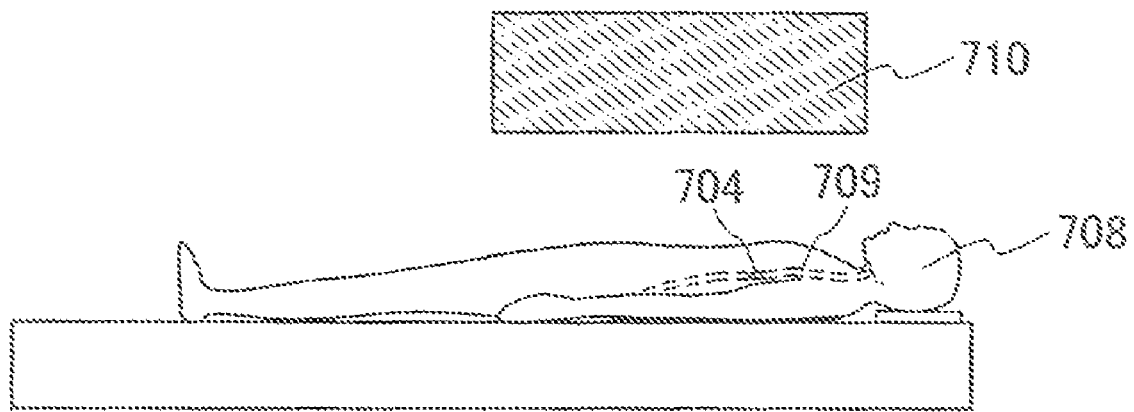

As shown in FIG. 9B, an examinee 708 swallows the microelectromechanical system 704, and the microelectromechanical system 704 is moved to a predetermined position in which the medicine is injected through a body cavity 709. A reader/writer 710 controls the microelectromechanical system 704, performs wireless communication, and discharges the medicine.

The microelectromechanical system 704 according to this embodiment mode is not limited to a medical purpose, and can be widely used as a remote-controlled discharge device. For example, mixture of chemicals with a worker at risk such as generation of harmful gas or possibility of explosion can be performed by remote-controlling the microelectromechanical system 704 according to this embodiment mode with a tank included in the region 700 having the microstructure of the microelectromechanical system 704 filled with the chemicals. Thus, a risk for the worker can be lowered significantly.

A microelectromechanical system, which is hard to be destroyed, excellent in a resistance property, and high reliability even while the microelectromechanical system moves in the body cavity 709, can be provided by using a microstructure according to the present invention.

Embodiment Mode 7

Figure 10A:
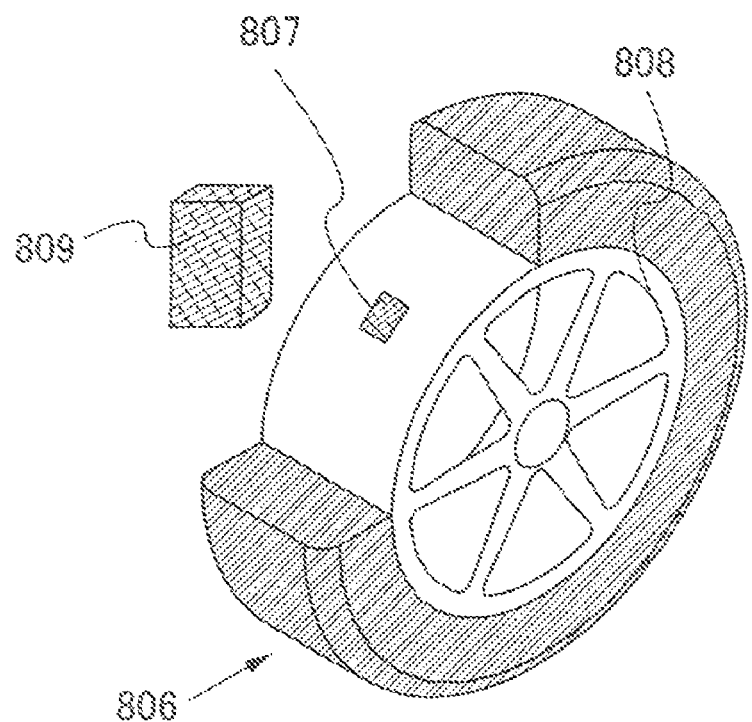
FIGS. 10A and 10B illustrate one form of a microelectromechanical system of the present invention.
Figure 10B:
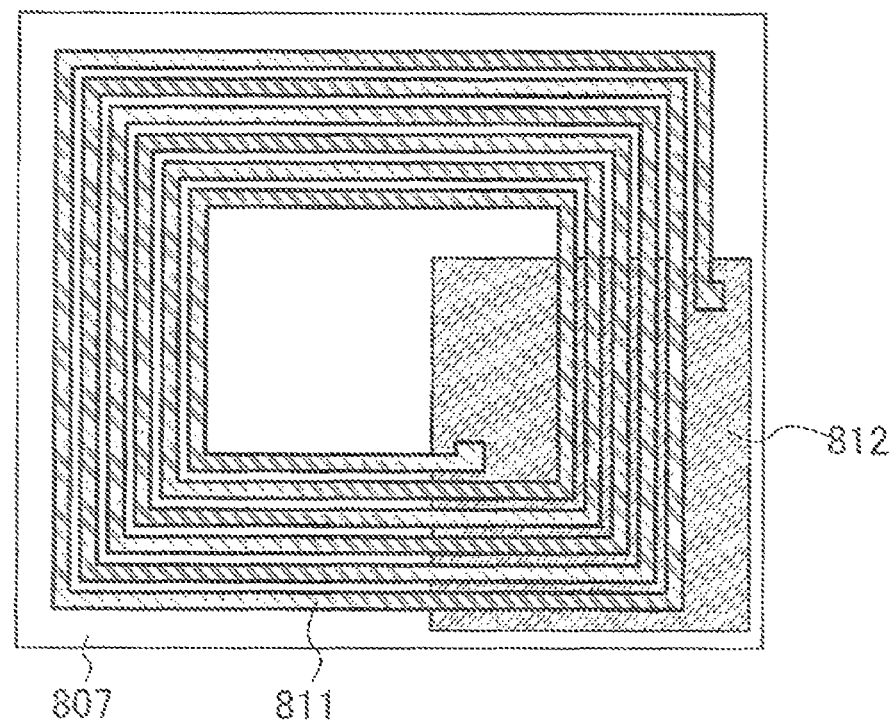

As a specific structural example and another application example of the microelectromechanical system having the wireless communication technique described in the embodiment mode are described in this embodiment mode with reference to FIGS. 10A and 10B.

Here, an example of a microelectromechanical system which is used as a pressure sensor is described. In the case where the microelectromechanical system is used as a pressure sensor, a diaphragm of a microstructure is provided with a stress detector, and size and thickness of the diaphragm are changed, so that a pressure sensor with various sensitivities can be designed.

When the pressure of a tire 806 of a car is lowered, the tire 806 deforms significantly and the resistance increases, which results in poor fuel economy and accidents. The microelectromechanical system according to this embodiment mode can provide a system for monitoring the pressure of the tire 806 relatively easily and regularly.

As shown in FIG. 10A, a microelectromechanical system 807 in which the microstructure according to the present invention is coated with a protective layer is placed at a wheel portion 808 of the tire 806.

Then, a reader/writer 809 is placed close to the microelectromechanical system 807 and performs wireless communication, thereby obtaining information on the pressure of the tire 806. The wireless communication technique or the like is similar to that in Embodiment Mode 4.

A structure of the microelectromechanical system 807 is shown in FIG. 10B. The microelectromechanical system 807 according to this embodiment mode includes a conductive film 811 which functions an antenna for inputting/outputting data to/from the reader/writer 809 without contact, and an electronic circuit portion 812 connected to the conductive film 811 functioning as an antenna. Note that the electronic circuit portion 812 is provided with a semiconductor element such as a thin film transistor or the microstructure according to the present invention.

The conductive film 811 functioning as an antenna is formed with a single layer or a stacked layer by a CVD method, a sputtering method, a droplet discharge method, a printing method such as a screen printing method, or the like, using an element selected from aluminum (Al), titanium (Ti), silver (Ag), copper (Cu), or gold (Au), or an alloy material or a compound material containing the element as its main component. For example, paste containing silver is used by a screen printing method, and then heat treatment is performed at a temperature of 50 to 350° C. to form the antenna. Alternatively, an aluminum film is formed by a sputtering method and the aluminum film is patterned to form the antenna. Wet etching processing may be used as pattern processing of the aluminum film and heat treatment may be performed at a temperature of 200 to 300° C. after the wet etching processing.

Note that as a signal transmission method in the microelectromechanical system which can input/output data without contact, an electromagnetic coupling method, an electromagnetic induction method, a microwave method, or the like can be used. The transmission system may be selected as appropriate by a practitioner in consideration of an intended use, and an optimum antenna may be provided in accordance with the transmission method.

In the case of employing, for example, an electromagnetic coupling method or an electromagnetic induction method (e.g., a 13.56 MHz band) as the signal transmission method in the microelectromechanical system, electromagnetic induction caused by a change in magnetic field density is used. Therefore, the conductive film functioning as the antenna is formed in a loop shape (e.g., a loop antenna) or a spiral shape (e.g., a spiral antenna).

In the case of employing a microwave method (e.g., a UHF band (860 to 960 MHz band), a 2.45 GHz band, or the like) as the signal transmission method in the microelectromechanical system, the shape such as a length of the conductive film functioning as the antenna may be set as appropriate in consideration of a wavelength of an electromagnetic wave used for signal transmission. For example, the conductive film functioning as the antenna can be formed in a linear shape (e.g., a dipole antenna), a flat shape (e.g., a patch antenna), a ribbon shape, or the like. The shape of the conductive film functioning as the antenna is not limited to a linear shape, and the conductive film functioning as the antenna may be provided in a curved-line shape, a meander shape, or a combination thereof, in consideration of a wavelength of an electromagnetic wave.

According to this embodiment mode, an pressure of tire can be monitored relatively easily and regularly without going to a car maintenance shop such as a gas station, by using a microelectromechanical system provided with an antenna.

Note that this embodiment mode can be freely combined as appropriate as long as this embodiment mode can be combined with the embodiment modes described above.

Embodiment 1

In this embodiment, steps before and after irradiating a metal layer of molybdenum used as a structure of a microstructure according to the present invention with laser are described with reference to FIGS. 11A and 11B.

Figure 11A:
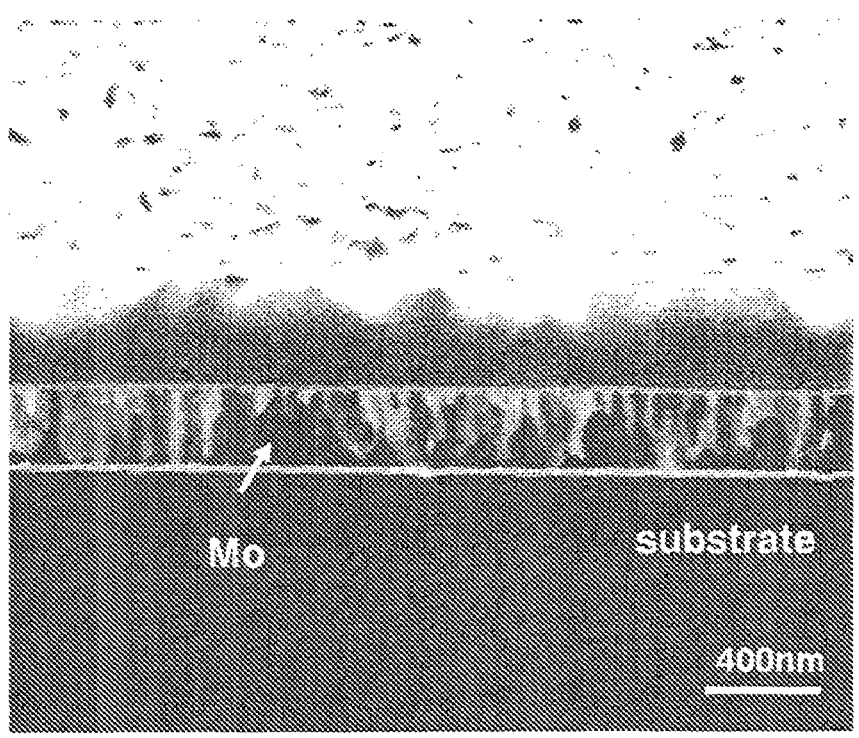
FIGS. 11A and 11B are each a cross-sectional SIM image of a structural layer which is used for a microstructure formed by a sputtering method.

FIG. 11A shows a cross-section SIM (Scanning Ion Microscope) image which is obtained by conducting FIB (Focused Ion Beam) processing to a molybdenum film which is formed over a quartz substrate and has a thickness of about 400 nm by a sputtering method. As shown by an arrow, a plurality of needle-like crystals is formed in a direction perpendicular to the substrate. Such needle-like crystals are weak in vibration of the direction in which crystals have grown, and are easy to be destroyed from grain boundaries by relatively small stress.

Figure 11B:
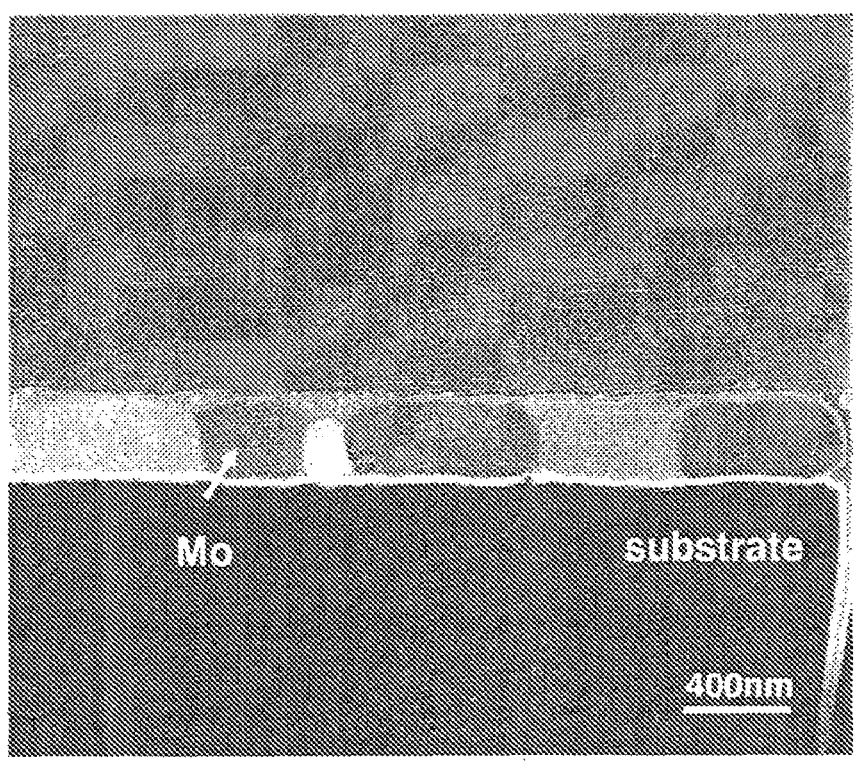

FIG. 11B shows a cross-section SIM image of a molybdenum film after a YAG laser irradiation is performed under the conditions of a scan rate of 500 mm/sec and an output of 200 W. Bulk-like crystal grains with a width of approximately 400 to 700 nm are seen. By laser irradiation, once the molybdenum film is melted and recrystallization is performed in a scanning direction of a laser, so that crystal grains which grow in the scanning direction can be obtained. Therefore, a microelectromechanical system which uses a microstructure according to the present invention is excellent in a resistance property of the microstructure, thereby obtaining high reliability.

This application is based on Japanese Patent Application serial No. 2005-345088 filed in Japan Patent Office on Nov. 30, 2005, the entire contents of which are hereby incorporated by reference.

What is claimed is:

1. A manufacturing method of a microstructure comprising:
   forming a lower electrode on and in contact with a first region of an insulating surface;
   forming a sacrificial layer to cover the lower electrode;
   forming a first conductive film comprising a crystal to cover the sacrificial layer;
   growing the crystal to increase a grain size of the crystal;
   forming a second conductive film over the first conductive film;
   etching a portion of the first conductive film and a portion of the second conductive film to expose a portion of the sacrificial layer; and
   removing the sacrificial layer after etching the portion of the first conductive film and the portion of the second conductive film,
   wherein the first region is provided between a second region and a third region of the insulating surface,
   wherein the etched first conductive film is on and in contact with the second region of the insulating surface and the third region of the insulating surface, and
   wherein the etched first conductive film is provided over the lower electrode.

2. The manufacturing method of a microstructure according to claim 1, wherein the first conductive film is formed by a sputtering method.

3. The manufacturing method of a microstructure according to claim 1, wherein the growing step is performed by irradiating the first conductive film with laser.

4. The manufacturing method of a microstructure according to claim 1, wherein the first conductive film comprises a metal material selected from the group consisting of W, Mo, Ti, Ta, Pt, and Ag.

5. The manufacturing method of a microstructure according to claim 1, wherein the second conductive film is formed by a sputtering method.

6. The manufacturing method of a microstructure according to claim 1, wherein the second conductive film comprises a crystal.

7. The manufacturing method of a microstructure according to claim 6, further comprising:
   growing the crystal to increase a grain size of the crystal of the second conductive film.

8. The manufacturing method of a microstructure according to claim 1, further comprising:
   irradiating the second conductive film with laser.

9. The manufacturing method of a microstructure according to claim 1, wherein the substrate is one selected from the group consisting of a glass substrate, a plastic substrate, a quartz substrate, and a silicon substrate.

10. The manufacturing method of a microstructure according to claim 3, wherein the laser is one or a plural selected from the group consisting of an Ar laser, a Kr laser, an excimer laser, a YAG laser, a Y2O3 laser, a YVO4 laser, a YLF laser, a YAlO3 laser, a glass laser, a ruby laser, an alexandrite laser, a Ti:sapphire laser, a copper vapor laser, and a gold vapor laser.

11. The manufacturing method of a microstructure according to claim 8, wherein the laser is one or a plural selected from the group consisting of an Ar laser, a Kr laser, an excimer laser, a YAG laser, a Y2O3 laser, a YVO4 laser, a YLF laser, a YAlO3 laser, a glass laser, a ruby laser, an alexandrite laser, a Ti:sapphire laser, a copper vapor laser, and a gold vapor laser.

12. A manufacturing method of a microstructure comprising:
- forming a lower electrode on and in contact with a first region of an insulating surface;
- forming a sacrificial layer to cover the lower electrode;
- forming a first conductive film comprising a crystal to cover the sacrificial layer;
- growing the crystal by melting and recrystallizing the crystal;
- forming a second conductive film over the first conductive film;
- etching a portion of the first conductive film and a portion of the second conductive film to expose a portion of the sacrificial layer; and
- removing the sacrificial layer after etching the portion of the first conductive film and the portion of the second conductive film,
- wherein the first region is provided between a second region and a third region of the insulating surface,
- wherein the etched first conductive film is on and in contact with the second region of the insulating surface and the third region of the insulating surface, and
- wherein the etched first conductive film is provided over the lower electrode.

13. The manufacturing method of a microstructure according to claim 12, wherein the first conductive film is formed by a sputtering method.

14. The manufacturing method of a microstructure according to claim 12, wherein the growing step is performed by irradiating the first conductive film with laser.

15. The manufacturing method of a microstructure according to claim 12, wherein the first conductive film comprises a metal material selected from the group consisting of W, Mo, Ti, Ta, Pt, and Ag.

16. The manufacturing method of a microstructure according to claim 12, wherein the second conductive film is formed by a sputtering method.

17. The manufacturing method of a microstructure according to claim 12, wherein the second conductive film comprises a crystal.

18. The manufacturing method of a microstructure according to claim 17, further comprising:
- growing the crystal of the second conductive film by melting and recrystallizing the crystal of the second conductive film.

19. The manufacturing method of a microstructure according to claim 12, further comprising:
- irradiating the second conductive film with laser.

20. The manufacturing method of a microstructure according to claim 12, wherein the substrate is one selected from the group consisting of a glass substrate, a plastic substrate, a quartz substrate, and a silicon substrate.

21. The manufacturing method of a microstructure according to claim 14, wherein the laser is one or a plural selected from the group consisting of an Ar laser, a Kr laser, an excimer laser, a YAG laser, a Y2O3 laser, a YVO4 laser, a YLF laser, a YAlO3 laser, a glass laser, a ruby laser, an alexandrite laser, a Ti:sapphire laser, a copper vapor laser, and a gold vapor laser.

22. The manufacturing method of a microstructure according to claim 19, wherein the laser is one or a plural selected from the group consisting of an Ar laser, a Kr laser, an excimer laser, a YAG laser, a Y2O3 laser, a YVO4 laser, a YLF laser, a YAlO3 laser, a glass laser, a ruby laser, an alexandrite laser, a Ti:sapphire laser, a copper vapor laser, and a gold vapor laser.

23. The manufacturing method of a microstructure according to claim 1, wherein the second conductive film comprises a metal material selected from the group consisting of W, Mo, Ti, Ta, Pt, and Ag.

24. The manufacturing method of a microstructure according to claim 12, wherein the second conductive film comprises a metal material selected from the group consisting of W, Mo, Ti, Ta, Pt, and Ag.

* * * * *